United States Patent
Shibata

(10) Patent No.: US 8,482,976 B2
(45) Date of Patent: Jul. 9, 2013

(54) SEMICONDUCTOR MEMORY DEVICE AND SEMICONDUCTOR MEMORY SYSTEM STORING MULTILEVEL DATA

(75) Inventor: Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 218 days.

(21) Appl. No.: 12/504,966

(22) Filed: Jul. 17, 2009

(65) Prior Publication Data

US 2010/0142270 A1 Jun. 10, 2010

(30) Foreign Application Priority Data

Dec. 9, 2008 (JP) .................................. 2008-313559

(51) Int. Cl.
*G11C 11/34* (2006.01)
*G11C 16/04* (2006.01)

(52) U.S. Cl.
USPC ............. 365/185.03; 365/185.18; 365/185.17

(58) Field of Classification Search
USPC ......................................... 365/185.01–185.33
See application file for complete search history.

(56) References Cited

U.S. PATENT DOCUMENTS

| | | | | |
|---|---|---|---|---|
| 6,829,163 | B2 * | 12/2004 | Miwa et al. ............. | 365/185.03 |
| 7,451,267 | B1 * | 11/2008 | Venkatachary et al. ...... | 711/108 |
| 7,852,671 | B2 * | 12/2010 | Bauer ...................... | 365/185.03 |
| 2007/0285980 | A1 * | 12/2007 | Shimizu et al. .......... | 365/185.03 |
| 2008/0209112 | A1 * | 8/2008 | Yu et al. ....................... | 711/103 |
| 2009/0323414 | A1 * | 12/2009 | Fibranz et al. ........... | 365/185.03 |

FOREIGN PATENT DOCUMENTS

| | | |
|---|---|---|
| JP | 2007-305210 | 11/2007 |
| JP | 2007-323731 | 12/2007 |

* cited by examiner

*Primary Examiner* — Kretelia Graham
(74) *Attorney, Agent, or Firm* — Oblon, Spivak, McClelland, Maier & Neustadt, L.L.P.

(57) ABSTRACT

A first memory cell stores data of k bits in one cell. A second memory cell stores data of h bits (h<k) in one cell. Data of i bits (i<=k) is stored in the first memory cell, and data of h bits (h<i) generated from the i-bit data is stored in the second memory cell.

20 Claims, 36 Drawing Sheets

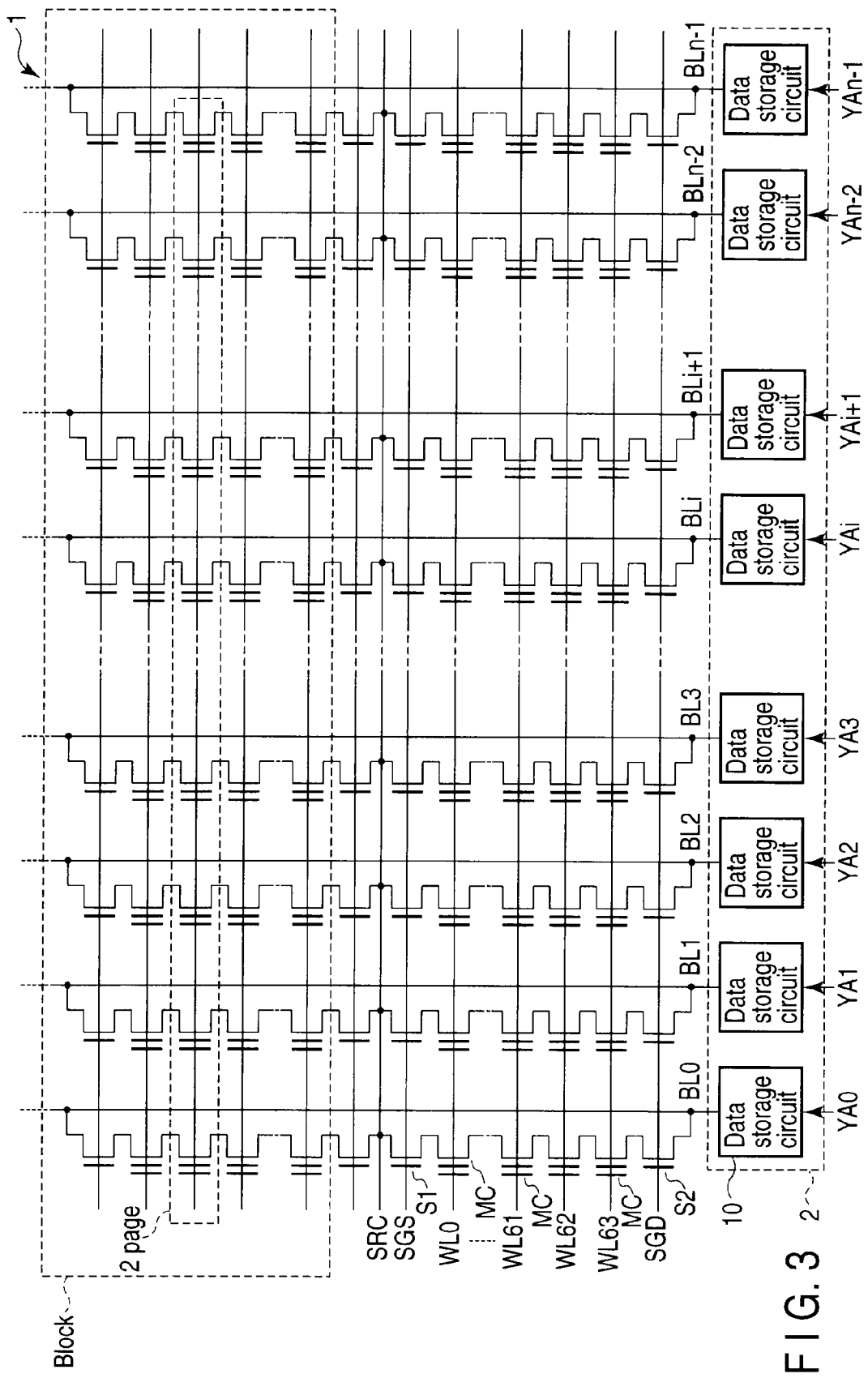
F I G. 3

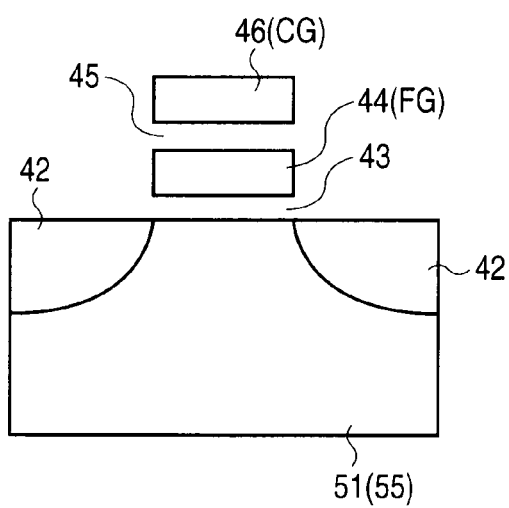 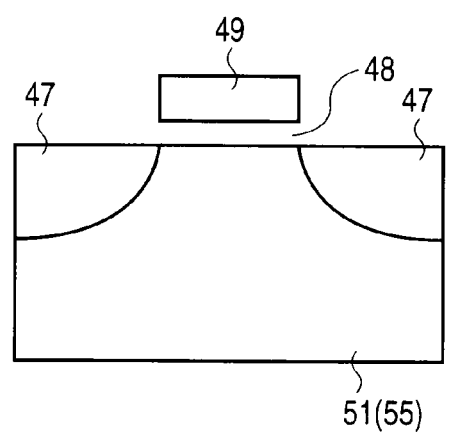
F I G. 4A    F I G. 4B

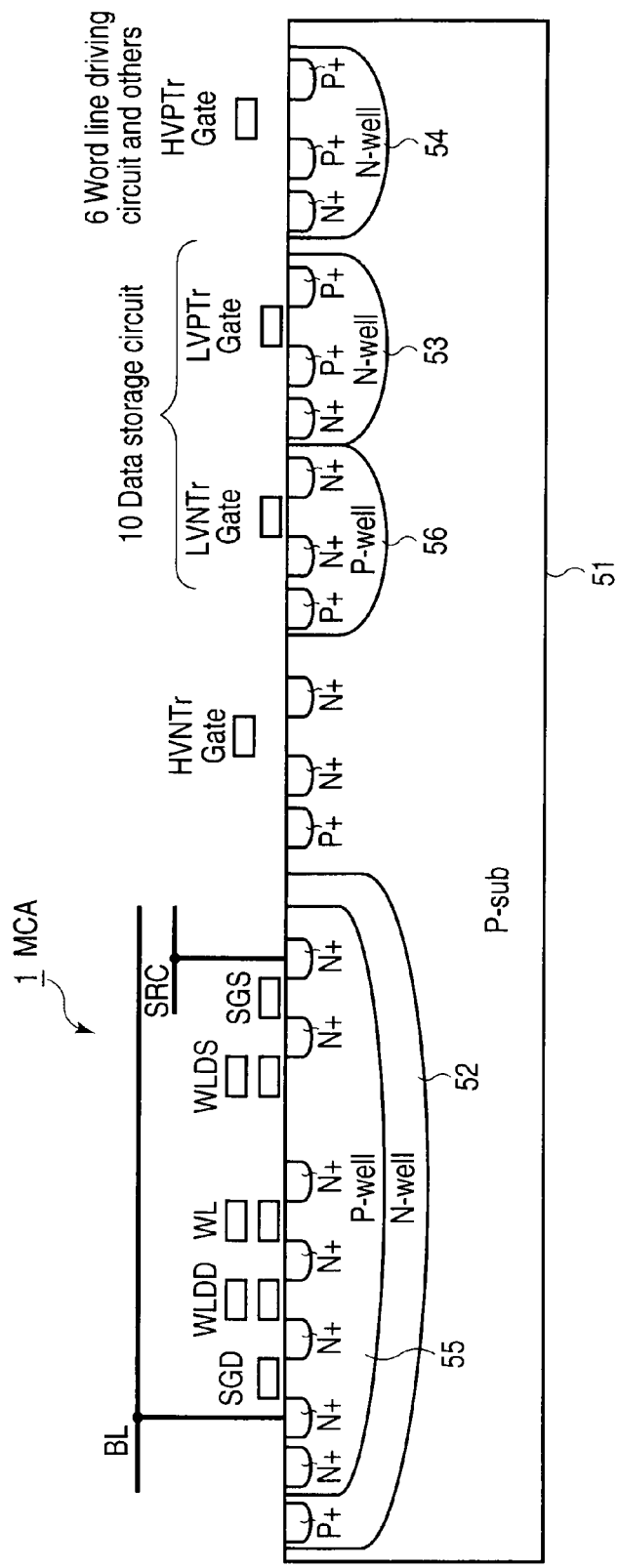
F I G. 5

| | Cell (P-Well) | Cell (N-Well) | H.V.Tr (P-sub) | L.V.Nch(P-well) | L.V.Pch (N-well) | H.V.Pch (N-well) |
|---|---|---|---|---|---|---|
| Erase | Vera (20V) | Vera (20V) | Vss (0V) | Vss (0V) | Vdd (2.5V) | Vdd (2.5V) |
| Program | Vss (0V) | Vss (0V) | Vss (0V) | Vss (0V) | Vdd (2.5V) | Vdd (2.5V) / Vpgmh |
| Read | Vss (0V) | Vss (0V) | Vss (0V) | Vss (0V) | Vdd (2.5V) | Vdd (2.5V) / Vreadh |

F I G. 6

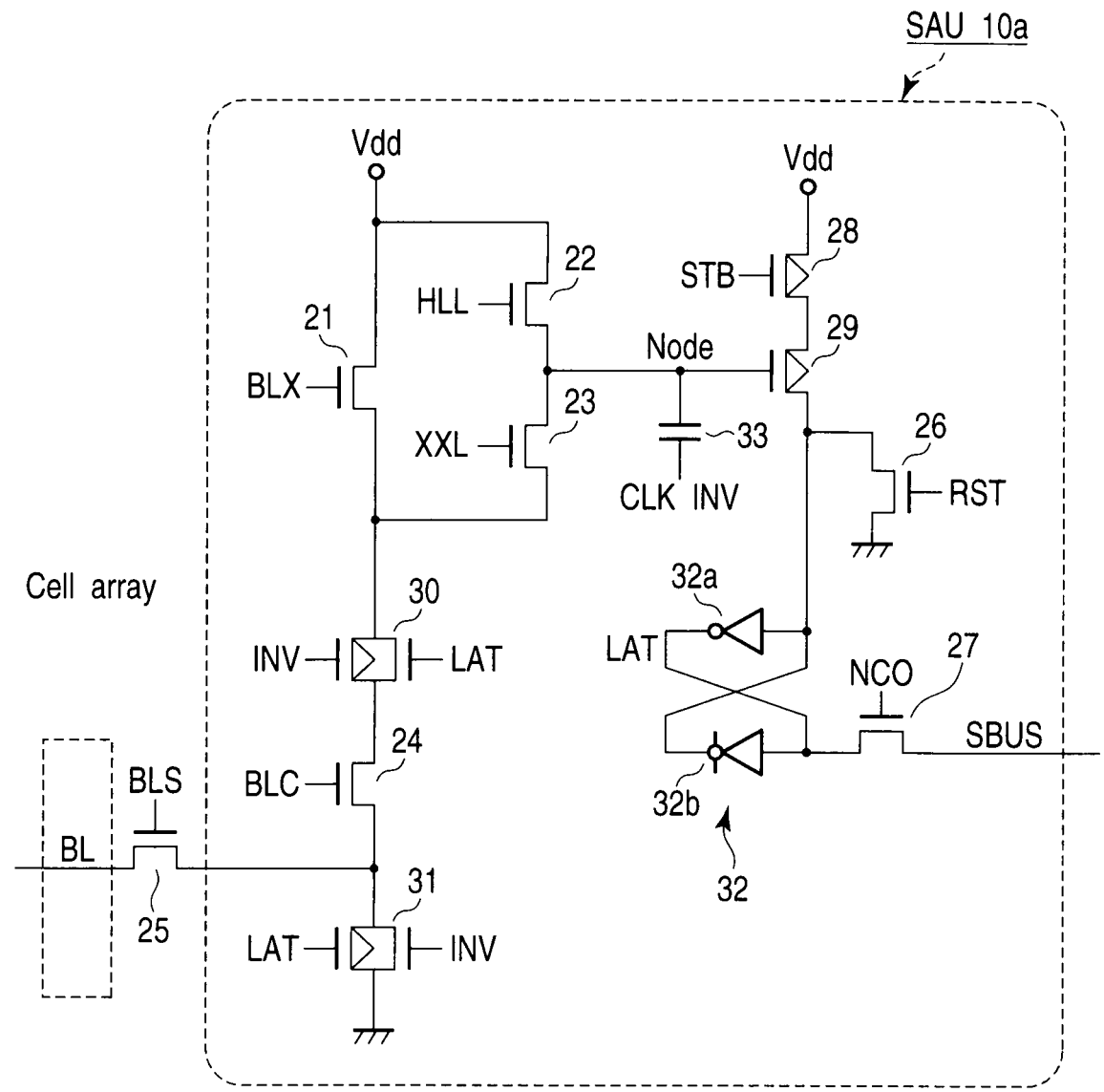
F I G. 7

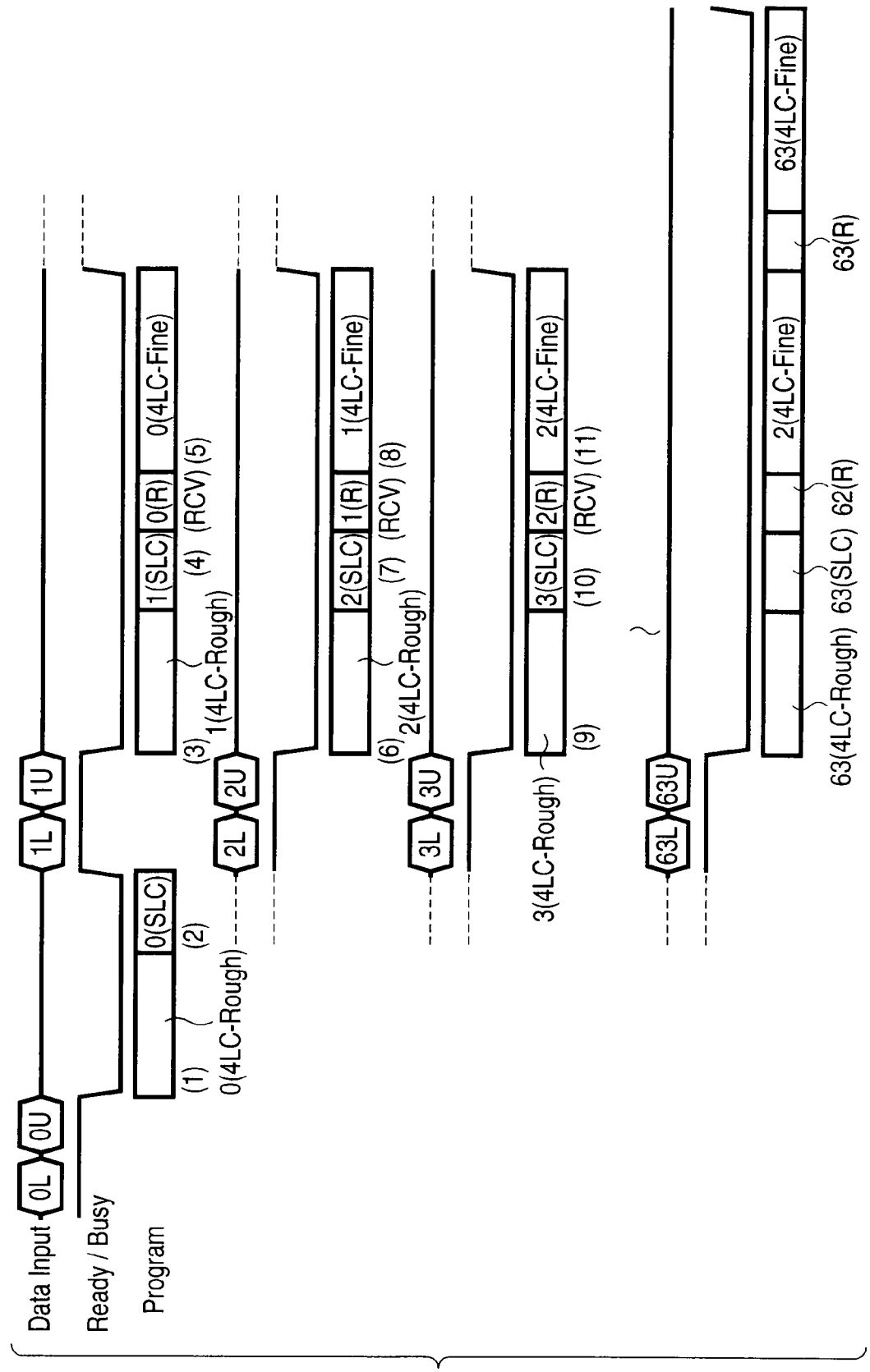
F I G. 15

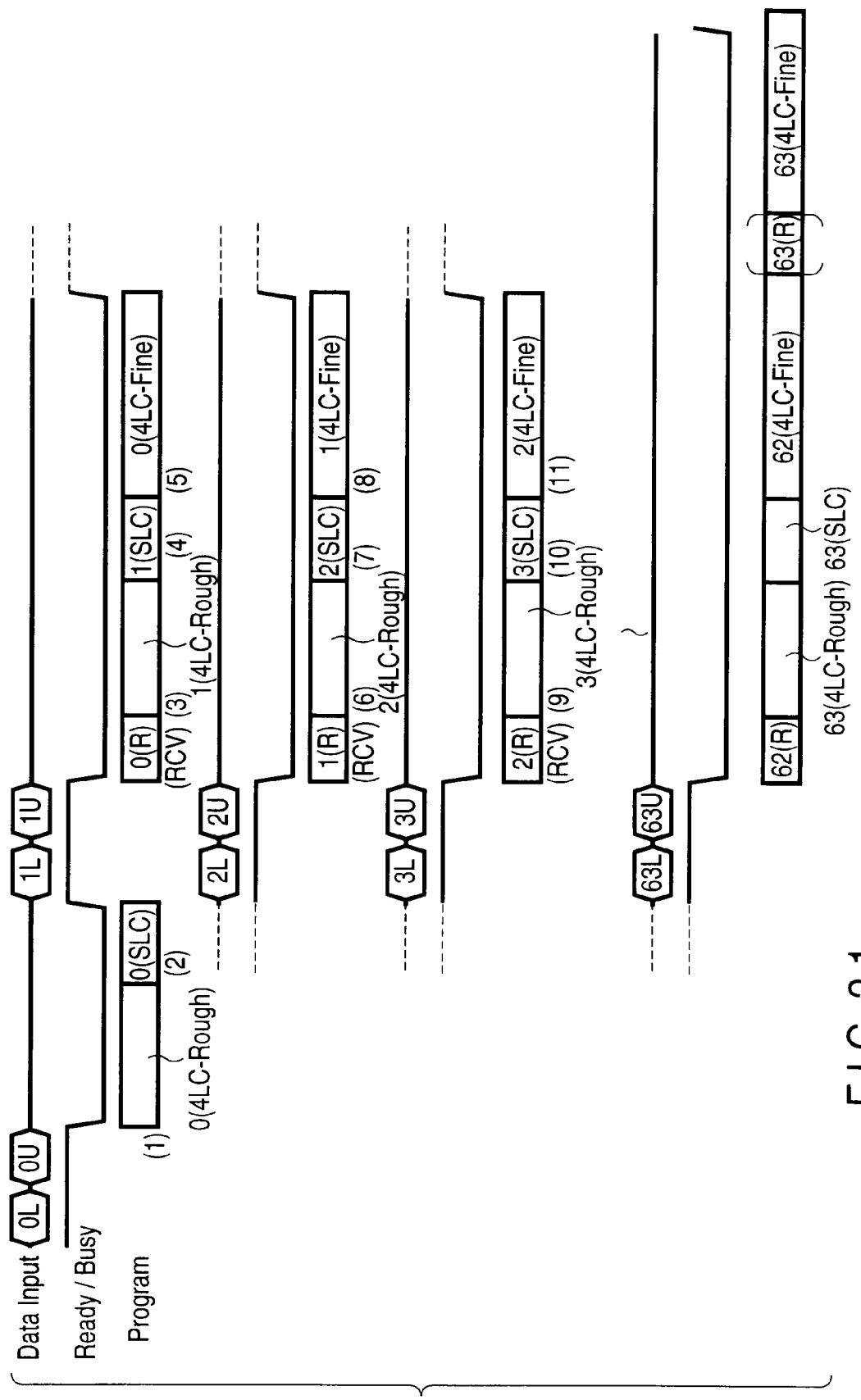
F I G. 2 1

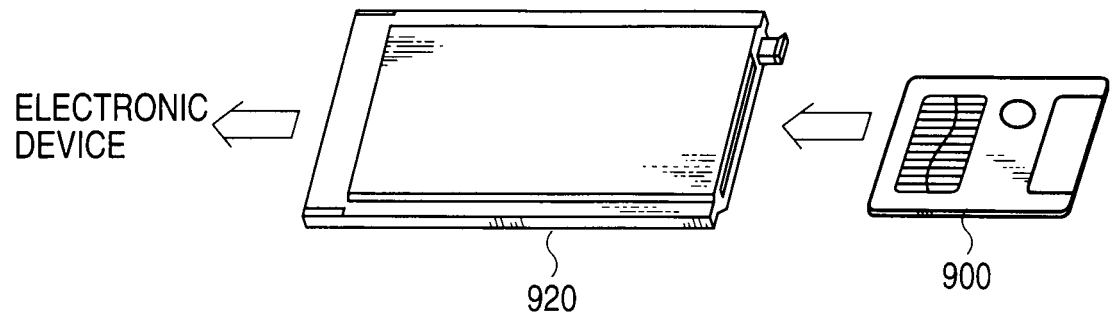
F I G. 3 4
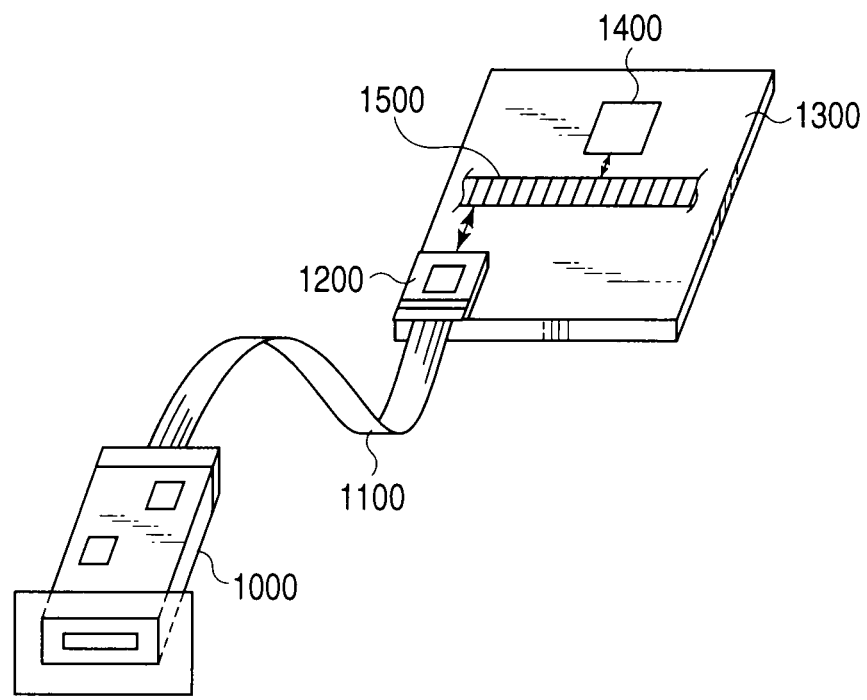
F I G. 3 5

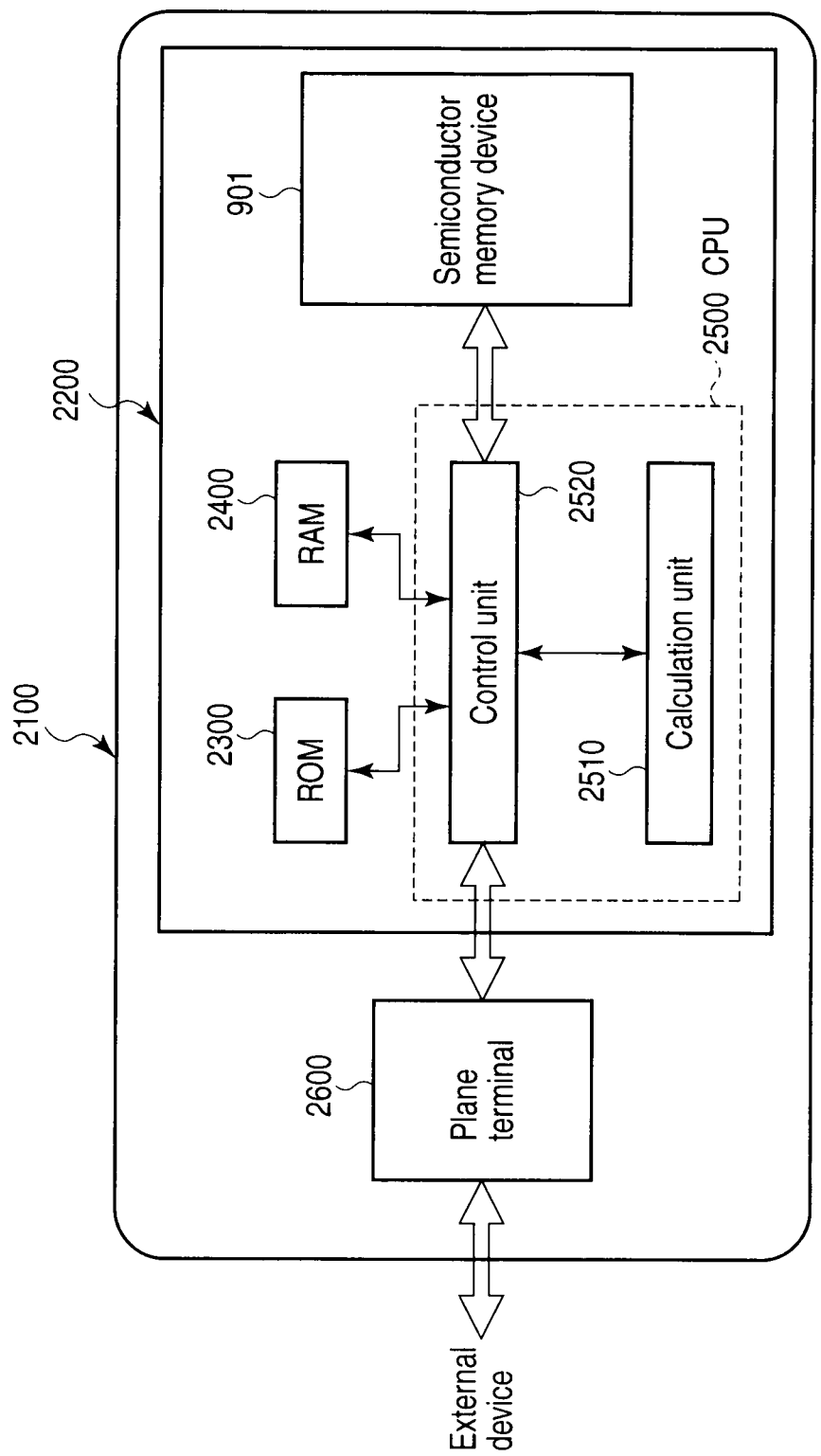
F I G. 38

SEMICONDUCTOR MEMORY DEVICE AND SEMICONDUCTOR MEMORY SYSTEM STORING MULTILEVEL DATA

CROSS-REFERENCE TO RELATED APPLICATIONS

This application is based upon and claims the benefit of priority from prior Japanese Patent Application No. 2008-313559, filed Dec. 9, 2008, the entire contents of which are incorporated herein by reference.

BACKGROUND OF THE INVENTION

1. Field of the Invention

The present invention relates to, e.g., a NAND flash memory, and to a semiconductor memory device and a semiconductor memory system that can store multilevel data.

2. Description of the Related Art

In a NAND flash memory, all or half of cells aligned in a row direction are connected with each of the writing or reading latch circuits through each of the bit lines. A write operation or a read operation is collectively carried out with respect to all or half of the cells (e.g., 2 to 8 kB cells) aligned in the row direction.

A write or read unit is called a page, and a plurality of pages constitute a block. Data in the memory cells are erased in units of blocks. Electrons are extracted from the memory cells by an erase operation to provide a negative threshold voltage, and introducing electrons into the memory cells by a write operation enables setting the threshold voltage to a positive value.

A multilevel memory that sets one of a plurality of threshold voltages (which will be also referred to as threshold levels hereinafter) in one memory cell to store data consisting of a plurality of bits has been recently developed. For example, data of 2 bits can be stored in one cell when 4 threshold levels are provided, and data of 3 bits can be stored in one cell when 8 threshold levels are provided. Further, data of 4 bits can be stored in one cell when 16 threshold levels are provided.

On the other hand, with the advancement of miniaturization of a device, capacitance coupling of cells adjacent to each other tends to increase. Therefore, there is a problem that a threshold level of a cell in which data has been written in the first place fluctuates with writing in an adjacent cell. To avoid this problem, there has been suggested a countermeasure that roughly writes data in an adjacent cell at a level lower than a target threshold level before finely writing the threshold level into a memory cell as a target level and then finely writes the threshold level into the memory cell as the target level, thereby suppressing a fluctuation in threshold level due to writing in the adjacent cell (see, e.g., JP-A 2007-323731 (KOKAI)).

However, data is supplied from the outside to the NAND flash memory in units of pages. Therefore, data in an adjacent cell in which data is to be subsequently written is unknown. Thus, there has been developed a technology that prepares a 2-level block in which data of n bits or smaller bits, e.g., 1 bit written at a 2-valued level is prepared separately from a multilevel block in which data of n bits as a multi-valued level into one cell, then writes data corresponding to several pages at the 2-valued level into the 2-level block initially, and moves this data to a multilevel block (see, e.g., JP-A 2007-305210 (KOKAI)).

However, for example, when storing 4 bits in 1 cell, or when writing 3 bits in 1 cell, a writing speed is lower than that in 2-level writing. Therefore, an increase in writing in the 2-level block is not large. However, when writing 2 bits (4 levels) in 1 cell, a time required to write data in the 2-level block is not greatly different from a time required to write data in a four-level block. Therefore, an increase in writing in the 2-level block is relatively large, thereby resulting in a problem that writing performance is degraded.

Accordingly, a semiconductor memory device that can suppress an influence of capacity coupling of cells adjacent to each other and write data at a high speed has been demanded.

BRIEF SUMMARY OF THE INVENTION

According to a first aspect of the invention, there is provided a semiconductor memory device comprising: a first memory cell configured to store data of k bits (k is a natural number of 2 or more); and a second memory cell configured to store data of h bits (h<k); wherein the first memory cell stores data of i bits (i<=K), and the second memory cell stores data of h bits (h<i) generated from the data of i bits.

According to a second aspect of the invention, there is provided a semiconductor memory system comprising: a first memory cell which stores data of k bits (k is a natural number of 2 or more); and data of i bits (i<=k) which stores data in the first memory cell, wherein the data of i bits is stored in the first memory cell to generate data of h bits (h<i) from the data of i bits.

According to a third aspect of the invention, there is provided a storage method of a semiconductor memory device, comprising: storing data of i bits (i<=k) (k is a natural number of 2 or more) in a first memory cell; and storing data of h bits (h<i) generated from the i-bit data in a second memory cell.

BRIEF DESCRIPTION OF THE SEVERAL VIEWS OF THE DRAWING

FIG. 3 is a circuit diagram showing another example of the structure of the memory cell array and the bit line control circuit depicted in FIG. 1;

FIG. 4A is a cross-sectional view of a memory cell and FIG. 4B is a cross-sectional view of a select gate;

FIG. 5 is a cross-sectional view of a semiconductor memory device according to a first embodiment;

FIG. 6 is a view showing voltages in respective units at the time of erasing, programming, and reading in FIG. 5;

FIG. 7 is a circuit diagram of a sense amplifier unit showing a part of a data storage circuit depicted in FIGS. 2 and 3;

FIG. 15 is a timing chart showing a write sequence according to the first embodiment;

FIG. 21 is a timing chart showing a write sequence according to a second embodiment;

FIGS. 33 to 41 are a diagram showing an example of other applications;

DETAILED DESCRIPTION OF THE INVENTION

Embodiments according to the present invention will now be described hereinafter with reference to the accompanying drawings.

First Embodiment

Figure 1:
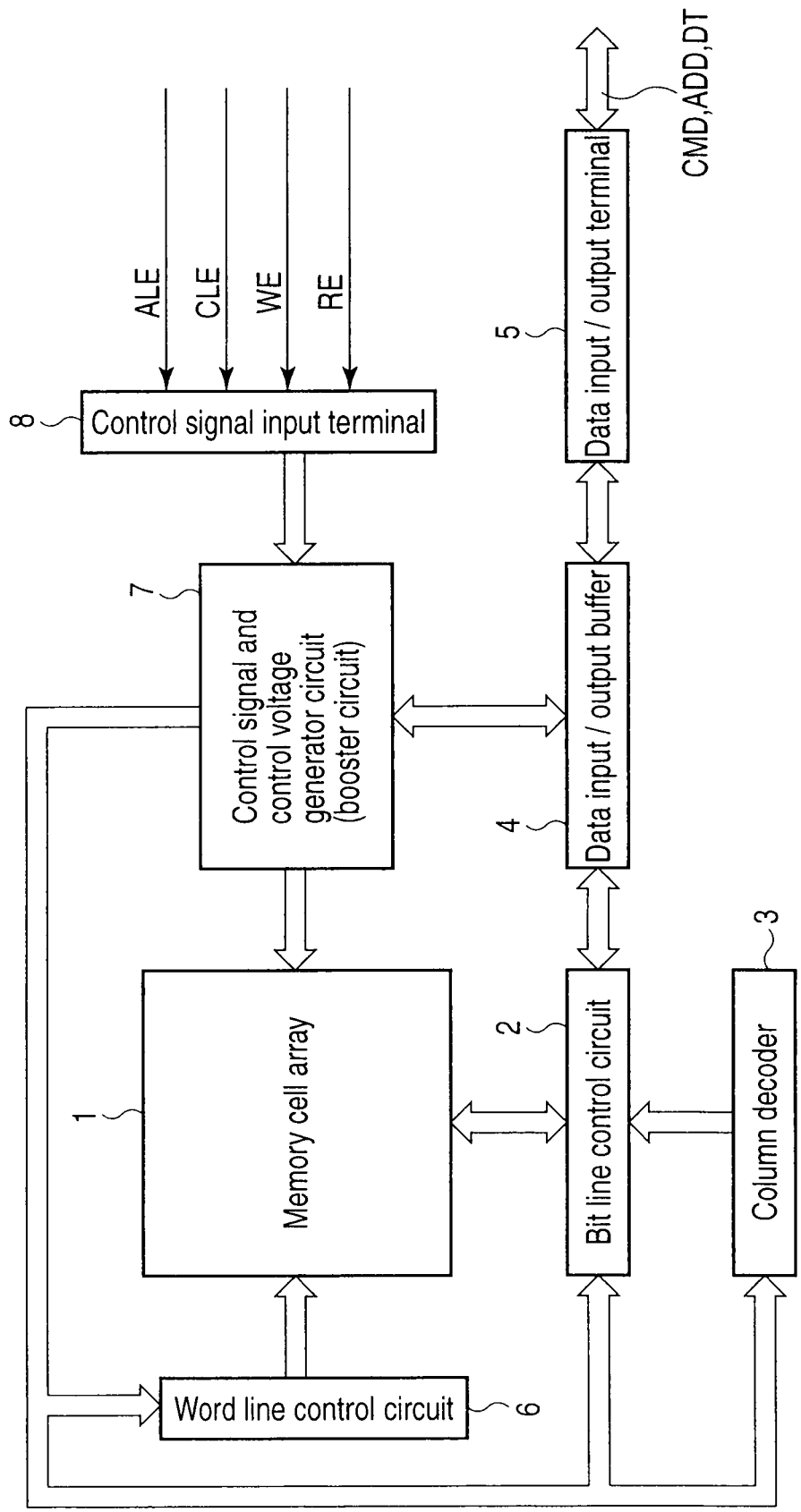
FIG. 1 is a block diagram showing a NAND flash memory as a semiconductor memory device that is applied to an embodiment according to the present invention.

FIG. 1 shows a NAND flash memory as a semiconductor memory device that stores 2 levels (one bit) or 4 levels (2 bits) in a memory cell.

A memory cell array 1 includes a plurality of bit lines, a plurality of word lines, and a common source line, and memory cells in which data can be electrically rewritten and which are made up of, for example, EEPROM cells are arranged in a matrix. A bit line control circuit 2 for controlling bit lines and a word line control circuit 6 are connected to the memory cell array 1.

The bit line control circuit 2 reads the data in a memory cell of the memory cell array 1 via a bit line, detects the state of a memory cell of the memory cell array 1 via a bit line, or writes data into a memory cell of the memory cell array 1 by applying a write control voltage to the memory cell via a bit line. A column decoder 3 and a data input/output buffer 4 are connected to the bit line control circuit 2. A data storage circuit in the bit line control circuit 2 is selected by the column decoder 3. The data in the memory cell read into the data storage circuit is output via the data input/output buffer 4 at a data input/output terminal 5 to the outside. The data input/output terminal 5 is connected to, for example, a non-illustrated host device outside the memory chip. The host device is composed of, for example, a microcomputer, and receives the data output from the data input/output terminal 5. Further, the host device outputs various commands CMD for controlling the operation of the NAND flash memory, addresses ADD, and data DT. The write data input to the data input/output terminal 5 from the host device is supplied via the data input/output buffer 4 to the data storage circuit selected by the column decoder 3, and the commands and addresses are supplied to a control signal and control voltage generator circuit 7.

The word line control circuit 6 is connected to the memory cell array 1. The word line control circuit 6 selects a word line in the memory cell array 1 and applies to the selected word line a voltage necessary for a read, write, or erase operation.

The memory cell array 1, the bit line control circuit 2, the column decoder 3, the data input/output buffer 4, and the word line control circuit 6 are connected to and controlled by the control signal and control voltage generator circuit 7. The control signal and control voltage generator circuit 7 is connected to a control signal input terminal 8 and is controlled by control signals ALE (address latch enable), CLE (command latch enable), and WE (write enable) input from the host device via the control signal input terminal 8. This control signal and control voltage generator circuit 7 generates a voltage for the word lines or the bit lines and also generates a voltage that is supplied to a well as will be described later. The control signal and control voltage generator circuit 7 includes, e.g., a booster circuit such as a charge pump circuit and can generate a program voltage, the above-explained voltage VX, and other high voltages, The bit line control circuit 2, the column decoder 3, the word line control circuit 6, and the control signal and the control voltage generator circuit 7 constitute a write circuit and a read circuit.

Figure 2:
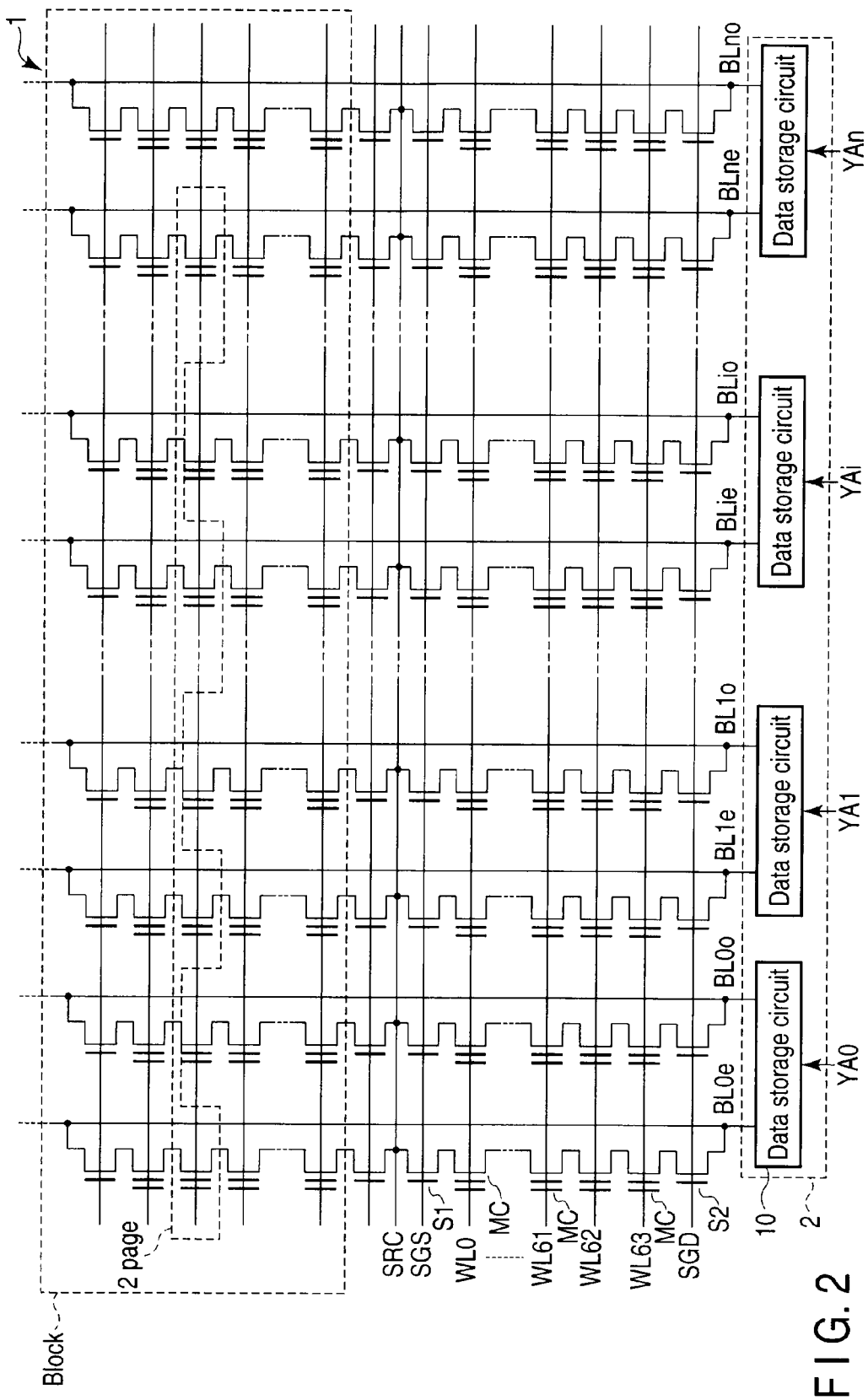
FIG. 2 is a circuit diagram showing an example of a structure of a memory cell array and a bit line control circuit depicted in FIG. 1.

FIG. 2 shows an example of a configuration of the memory cell array 1 and bit line control circuit 2 shown in FIG. 1. In the memory cell array 1, a plurality of NAND cells are arranged. A NAND unit is composed of, for example, a memory cell MC made up of, for example, 64 EEPROMs connected in series and select gates S1 and S2. The select gate S2 is connected to a bit line BL0e and the select gate S1 is connected to a source line SRC. The control gates of the memory cells MC arranged in each row are connected equally to the word lines WL0 to WL63. The select gates S2 are connected equally to a select line SGD. The select gates S1 are connected equally to a select line SGS.

The bit line control circuit 2 has a plurality of data storage circuits 10. Bit line pairs (BL0e, BL0o), (BL1e, BL1o), ..., (BLie, BLio), (BLne, BLno) are connected to the individual data storage circuits 10 in a one-to-one correspondence.

The memory cell array 1 includes a plurality of blocks as shown by a broken line. Each block is composed of a plurality of NAND units, and data is erased in, for example, blocks. An erase operation is performed simultaneously on the two bit lines connected to the data storage circuit 10.

A plurality of memory cells which are arranged on every other bit line and are connected to a single word line (or the memory cells enclosed by a broken line) constitute one sector. Data is written or read in accordance with each sector. That is, half of a plurality of memory cells arranged in the row direction are connected with corresponding bit lines. Therefore, a write or read operation is executed with respect to each half of the plurality of memory cells arranged in the row direction.

In a read operation, a program verify operation, and a program operation, one of the two bit lines (BLie, BLio) connected to the data storage circuit 10 is selected according to the address signals (YA0, YA1, ..., YAi, ..., YAn) externally supplied. Moreover, according to an external address, a single word line is selected, and two pages enclosed by a dotted line are selected. Switching between two pages is done by an address.

When 2 bits are stored in one cell, two pages are selected; when 1 bit is stored in one cell, a selection is made by a 1-page address; when 3 bits are stored in one cell, a selection is made by a 3-page address; and when 4 bits are stored in one cell, a selection is made by a 4-page address.

FIG. 3 shows another example of the structure of the memory cell array 1 and the bit line control circuit 2 depicted in FIG. 1. In the structure depicted in FIG. 2, the two bit lines (BLie, BLio) are connected with the data storage circuit 10. On the other hand, in the structure shown in FIG. 3, the data storage circuit 10 is connected with each bit line, and a plurality of memory cells arranged in the row direction are all connected with corresponding bit lines. Therefore, a write or read operation can be executed with respect to all the memory cells arranged in the row direction.

It is to be noted that both the structure shown in FIG. 2 and the structure depicted in FIG. 3 can be applied to the following description, but an example using FIG. 3 will be explained below.

FIGS. 4A and 4B show a cross-sectional view of a memory cell and that of a select transistor, respectively. FIG. 4A shows a memory cell. An n-type diffused layer 42 acting as a source and a drain of a memory cell is formed in a substrate 51 (or a p-well region 55 described later). Above the p-well region 55, a floating gate (FG) 44 is formed via a gate insulating film 43. Above the floating gate 44, a control gate (CG) 46 is formed via an insulating film 45. FIG. 4B shows the select gate. In the p-well region 55, an n-type diffused layer 47 serving as a source and a drain is formed. A control gate 49 is formed above the p-well region 55 through a gate insulating film 48.

FIG. 5 is a cross-sectional view of the NAND flash memory. For example, in a p-type semiconductor substrate 51, n-well regions 52, 53, and 54 and a p-well region 56 are formed. In the n-well region 52, the p-well region 55 is formed. In the p-well region 55, low-voltage n-channel transistors LVNTr constituting the memory cell array 1 are formed. In the n-well region 53 and the p-well region 56, a low-voltage p-channel transistor LVPTr and a low-voltage n-channel transistor LVNTr constituting a data storage circuit 10 are formed, respectively. In the substrate 51, a high-voltage n-channel transistor HVNTr connecting a bit line and the data storage circuit 10 is formed. Further, in the n-well region 54, a high-voltage p-channel transistor HVPTr constituting, for example, a word-line driving circuit or the like is formed. As shown in FIG. 5, the high-voltage transistors HVNTr and HVPTr have, for example, a thicker gate insulating film than that of the low-voltage transistors LVNTr and LVPTr.

FIG. 6 shows an example voltages supplied to the respective regions depicted in FIG. 5. Such voltages as shown in FIG. 6 are supplied to the respective regions in erase, program, and read operations. Here, Vera is a voltage applied to the substrate when erasing data, Vss is a ground voltage, and Vdd is a power supply voltage. VX is a boosted or reduced voltage higher than Vdd, and VpgmH is a voltage applied to a gate of an N-channel MOS transistor in a row decoder when writing data and also a potential that allows application of a write voltage Vpgm of a word line without being reduced by an amount corresponding to a threshold voltage of the N-channel MOS transistor. That is, it is a voltage Vpgm+Vth (Vth: a threshold voltage of the N-channel MOS transistor) supplied to a word line. VreadH is a voltage applied to the gate of the N-channel MOS transistor in the row decoder and also a potential that allows application of Vread without being reduced by an amount corresponding to the threshold voltage of the N-channel MOS transistor. That is, it is a voltage supplied to the word line and is Vread+Vth (Vth: the threshold voltage of the N-channel MOS transistor) in a read operation.

Further, there are Vpass as a voltage supplied to a word line of a non-selected cell when writing data and Vread as a voltage supplied to a non-selected word line when reading data.

Figure 8:
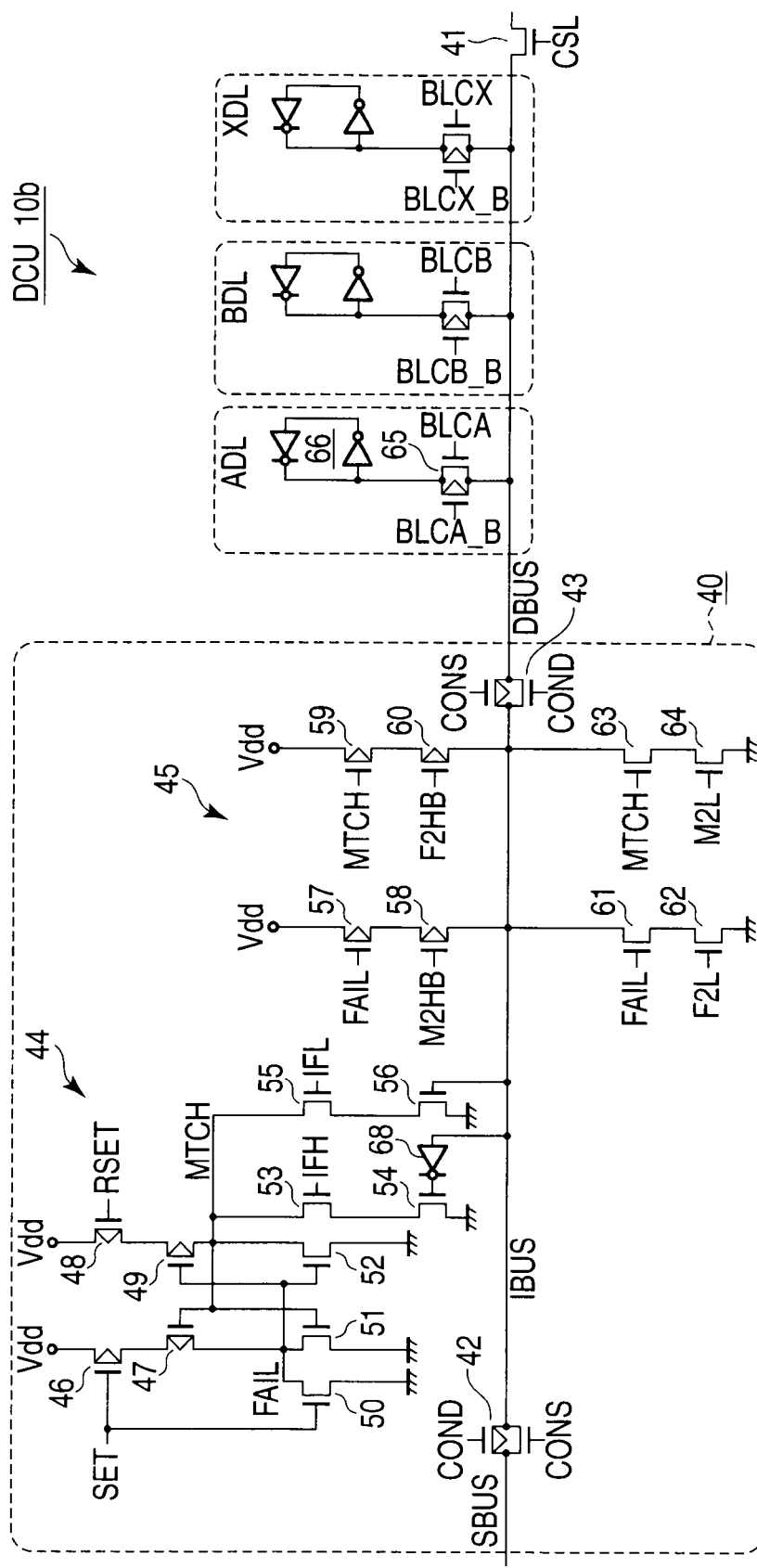
FIG. 8 is a circuit diagram of a data control unit showing a part of the data storage circuit depicted in FIGS. 2 and 3.

FIGS. 7 and 8 show an example of the data storage circuit 10 shown in FIG. 3. The data storage circuit 10 is composed of a sense amplifier unit (SAU) 10a shown in FIG. 7 and a data control unit (DCU) 10b shown in FIG. 8.

In FIG. 7, the sense amplifier unit 10a is composed of a plurality of N-channel MOS transistors (hereinafter, referred to as NMOSs) 21 to 27, a plurality of P-channel MOS transistors (hereinafter, referred to as PMOSs) 28 and 29, and transfer gates 30 and 31, a latch circuit 32, and a capacitor 33. The latch circuit 32 is composed of, e.g., clocked inverter circuits 32a and 32b.

One end of the current path of the NMOS 21 is connected to a node to which a power supply Vdd is supplied. The other end of the current path is connected to the ground via the transfer gate 30, the NMOS 24, and the transfer gate 31. One end of the current path of NMOS 25 is connected to a connection node of the NMOS 24 and the transfer gate 31. The other end of NMOS 25 is connected to a bit line BL arranged in the memory cell array. A series circuit of the NMOS 22 and the NMOS 23 is connected in parallel to the NMOS 21.

Additionally, one end of the current path of the PMOS 28 is connected to a node to which the power supply Vdd is supplied. The other end of the current path is connected not only to the input end of the inverter circuit 32a constituting the latch circuit 32 via the PMOS 29 but also to the ground via the NMOS 26. The input end of the clocked inverter circuit 32b cross-coupled with the inverter circuit 32a is connected to a data control unit (DCU) 10b via the NMOS 27. Further, the gate of the PMOS 29 is connected to a connection node of the NMOS 22 and the NMOS 23. One end of the capacitor 33 is connected to the connection node. A clock signal CLK is supplied to the other end of the capacitor 33.

A signal BLX is supplied to the gate of the NMOS 21. A signal LAT at the output end of the inverter circuit 32a constituting the latch circuit 32 is supplied to the gate of the NMOS constituting the transfer gate 30. A signal INV at the input end of the inverter circuit 32a is supplied to the gate of the PMOS transistor. A signal BLC is supplied to the gate of the NMOS 24 and a signal BLS is supplied to the gate of the NMOS 25.

A signal HLL is supplied to the gate of the NMOS S22 and a signal XXL is supplied to the gate of the NMOS S23.

A signal STB is supplied to the gate of the PMOS 28 and a reset signal RST is supplied to the gate of the NMOS 26. A signal NCO is supplied to the gate of the NMOS 27.

The operation of the sense amplifier unit will be explained briefly.

(Write Operation)

When data is written into a memory cell, first, a signal STB is set at the high level (hereinafter, referred to as level H) and a reset signal RST is set temporarily at level H, thereby resetting the latch circuit 32. Thus, it follows that a signal LAT=level H and a signal INV=a low level (hereinafter, referred to as level L).

Thereafter, when a signal NCO is set to level H, the data is taken in from the data control unit 10b. If the data is at level L ("0") indicating writing, it follows that the signal LAT=level L and the signal INV=level H. If the data is at level H ("1") indicating non-writing, the data in the latch circuit 32 remains unchanged: the signal LAT=level H and the signal INV=level L.

Next, when a signal BLX, a signal BLC, and a signal BLS are set to level H, if the latch circuit is in the following state: the signal LAT=level L and the signal INV=level H (writing), then the transfer gate 30 goes off and the transfer gate 31 goes on, setting the bit line BL to Vss. In this state, when a word line has reached a program voltage Vpgm, data is written into the memory cell.

On the other hand, in the latch circuit 32, when the signal LAT=level H and the signal INV=level L (non-writing), the transfer gate 30 is on and the transfer gate 31 is off, causing the bit line BL to be charged to Vdd. Therefore, when the word line has reached Vpgm, the channel of the cell is boosted to a higher potential, preventing data from being written into the memory cell.

(Read Operation, Program Verify Read Operation)

When the data is read from a memory cell, first, a reset signal RST is set to level H temporarily, resetting the latch circuit 32. Thus, it follows that the signal LAT=level H and the signal INV=level L. Thereafter, a signal BLS, a signal BLC, a signal BLX, a signal HLL, and a signal XXL are set to level H, thereby charging the bit line BL. In parallel with this, Node of the capacitor 33 is charged to Vdd. Here, if the threshold voltage of the memory cell is higher than the read level, the memory cell is in the off state, maintaining the bit line at level H. That is, Node remains at level H. If the threshold voltage of the memory cell is lower than the read level, the memory cell goes into the on state, causing the charge on the bit line to be discharged, which brings the bit line BL into level L. Consequently, Node goes into level L.

Next, when a signal STB is set to level L, if the memory cell is on, Node is at level L, and hence the PMOS 29 is turned on. Thus, it follows that the signal INV=level H and the signal LAT=level L in the latch circuit 32. On the other hand, if the memory cell is off, the signal INV and the signal LAT in the latch circuit 32 remain unchanged as follows: INV=level L and LAT=level H.

Thereafter, when a signal NCO is set to level H, the NMOS 27 goes on, causing the data in the latch circuit 32 to be transferred to the data control unit 10b.

After the write operation, a program verify operation to verify the threshold voltage of the memory cell is carried out almost in the same manner as the read operation.

FIG. 8 shows an example of the data control unit (DCU) 10b.

The data control unit 10b of FIG. 8 is composed of an arithmetic circuit 40 and a plurality of data latch circuits ADL, BDL, XDL, and NMOS 41.

The arithmetic circuit 40 is composed of a bus (hereinafter, referred to as an IBUS), transfer gates 42 and 43 which are connected to both ends of the IBUS and operate complementarily, a latch circuit 44 which latches data on the IBUS, and a setting circuit 45 which sets levels of the data latch circuits ADL, BDL, and XDL according to the data in the latch circuit 44.

The transfer gate 42 operates on the basis of complementary signals COND and CONS to connect the bus of sense amplifier unit SAU 10a (referred to as an SBUS) and the IBUS. The transfer gate 43 operates on the basis of complementary signals CONS and COND to connect the IBUS and the bus to which the data latch circuits ADL, BDL, and XDL are connected (hereinafter, referred to as a DBUS). If the transfer gate 42 is on, the transfer gate 43 is off. If the transfer gate 42 is off, the transfer gate 43 is on.

The latch circuit 44 is composed of a plurality of PMOSs 46 to 49, a plurality of NMOSs 50 to 56, and an inverter circuit 68. A set signal SET is supplied to the gates of the PMOS 46 and the NMOS 50. A reset signal RSET is supplied to the gate of a PMOS 48. A signal IFH is supplied to the gate of an NMOS 53 and a signal IFL is supplied to the gate of an NMOS 55. The gate of an NMOS 54 is connected with the IBUS through the inverter 68, and the gate of an NMOS 56 is connected with the IBUS.

The setting circuit 45 is composed of PMOSs 57 to 60 and NMOS 61 to 64. A signal FAIL is supplied to the gates of PMOS 57 and NMOS 61. This signal FAIL is a signal at a connection node of the PMOS 47 and the NMOS 51 as one output end of the latch circuit 44. A signal MTCH is supplied to the gates of PMOS 59 and NMOS 63. This signal MTCH is a signal at a connection node of the PMOS 49 and the NMOS 52 as the other output end of the latch circuit 44. Moreover, a signal M2HB is supplied to the gate of PMOS 58, and a signal F2HB is supplied to the gate of PMOS 60. A signal F2L is supplied to the gate of NMOS 62, and a signal M2L is supplied to the gate of NMOS 64.

Each of data latch circuits ADL, BDL, and XDL has the same configuration and is composed of a latch circuit 66 and a transfer gate 65 that connects the latch circuit 66 to the DBUS. The individual transfer gates 65 are controlled by a signal BLCA, a signal BLCB, signal BLCC, and a signal BLCX, respectively. A data latch circuit XDL is connected via an NMOS 41 to an external IO. A signal CSL is supplied to the gate of NMOS 41.

As described above, the data control unit 10b not only holds write data but also holds the data read from a memory cell in a read operation.

The 2-bit write data supplied from the data input/output buffer 6 is latched in, e.g., the data latch circuits ADL and BDL via the data latch circuit XDL in such a manner that each of the data latch circuits holds one bit.

The arithmetic circuit 40 of FIG. 8 can perform AND, OR, and exclusive NOR operations on the data in the data latch circuits ADL and BDL. In case of an AND operation, data held in the data latch circuits ADL and BDL is output to the DBUS and the IBUS. In this case, when both the data held in the data latch circuits ADL and BDL are "1", the IBUS alone is changed to level H. In any other case, it is changed to level L. That is, the IBUS is set to "1" in a non-write operation alone, and the IBUS is set to "0" in a write operation. Transferring this data to the sense amplifier unit 10a depicted in FIG. 7 via the SBUS enables writing data.

The single arithmetic circuit 40 depicted in FIG. 8 may be arranged with respect to the plurality of sense amplifier units (SAUs) 10a shown in FIG. 7 and the plurality of data control units (DCUs) shown in FIG. 8, thereby decreasing a circuit area.

The operation of the arithmetic circuit 40 can be modified in many ways, various control methods can be applied to, e.g., one logical operation, and the control method can be changed as required.

This NAND flash memory is a multilevel memory. Therefore, 2-bit data can be stored in one cell. This 2-bit data can be switched based on an address (a first page or a second page). When 2 bits are stored in one cell, two pages are selected; and when 3 bits are stored in one cell, the respective bits are switched by an address (a first page, a second page, or a third page). Furthermore, when 4 bits are stored in one cell, the bits are switched by an address (a first page, a second page, a third page, or a fourth page).

Figure 9:
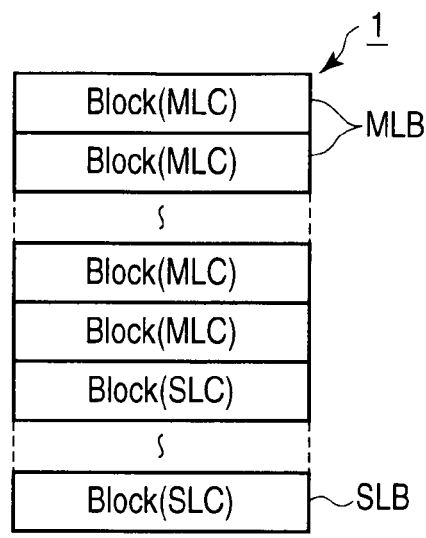
FIG. 9 is a block diagram schematically showing a memory region of the memory cell array.

FIG. 9 schematically shows a structure of a storage region of the memory cell array. The memory cell array 1 has a plurality of blocks as described above. In this embodiment, these blocks are defined as a block MLB and a block SLB. The block MLB is formed of a multilevel cell (MLC) that stores n bits in one memory cell, and the block SLB is formed of a cell that stores k bits (k<n) in one memory cell. In this embodiment, for simplicity, it is assumed that k=1 and the block SLB is a block formed of a cell (SLC) that stores 2-level data (1 bit). The numbers of the blocks MLB as multilevel regions and the blocks SLB as 2-level regions or positions of the same in the memory cell array 1 are arbitrary. Addresses of the blocks MLBs or and the blocks SLB are controlled by, e.g., a non-illustrated external controller.

Further, in this embodiment, an example where data in cells aligned in the row direction as shown in FIG. 3 are collectively read out will be described.

Figure 10:
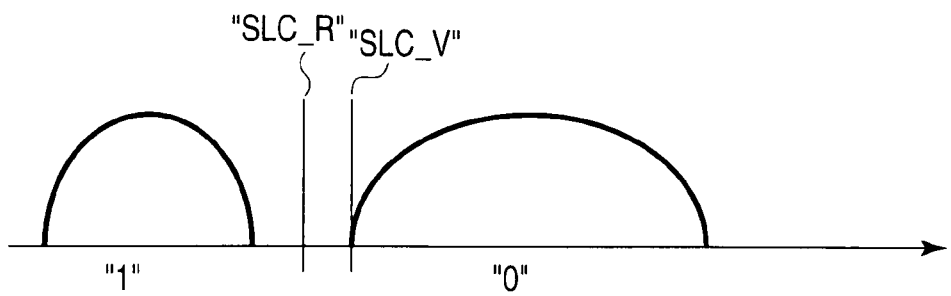
FIG. 10 is a view showing an example of a threshold distribution of a block SLB as a 2-level region depicted in FIG. 9.

FIG. 10 shows an example of a threshold level and a read level written into a memory cell in the block SLB. Data in the memory cell is changed to a threshold level "1" by an erase operation, and level is changed to a threshold level "0" when data "0" is written.

In data reading, a threshold level of the memory cell is judged based on a level SLC_R between the threshold levels "1" and "0". A verify level in a write operation is a value slightly different from a level in a read operation in order to provide a data retention margin. That is, in this embodiment, a level in the read operation is SLC_R, and a level in the verify read operation is SLC_V.

Figure 11:
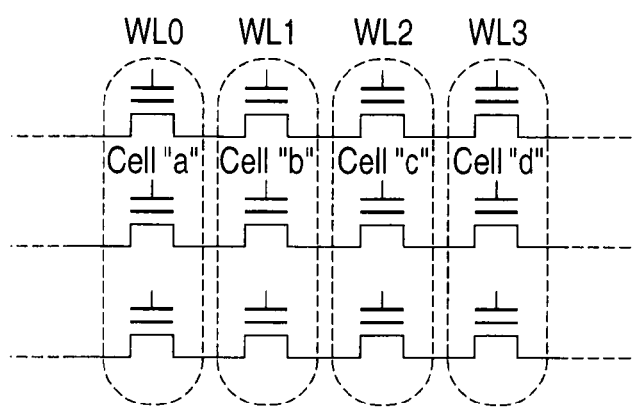
FIG. 11 is a view showing an example of a write order for memory cells.

FIG. 11 shows an example of a write order for memory cells. In the NAND flash memory, memory cells are sequentially selected from the source line side, and data is written in the selected memory cells. That is, as shown in FIG. 11, the memory cells are selected in the order of memory cells "a", "b", "c", and "d".

Figure 12:
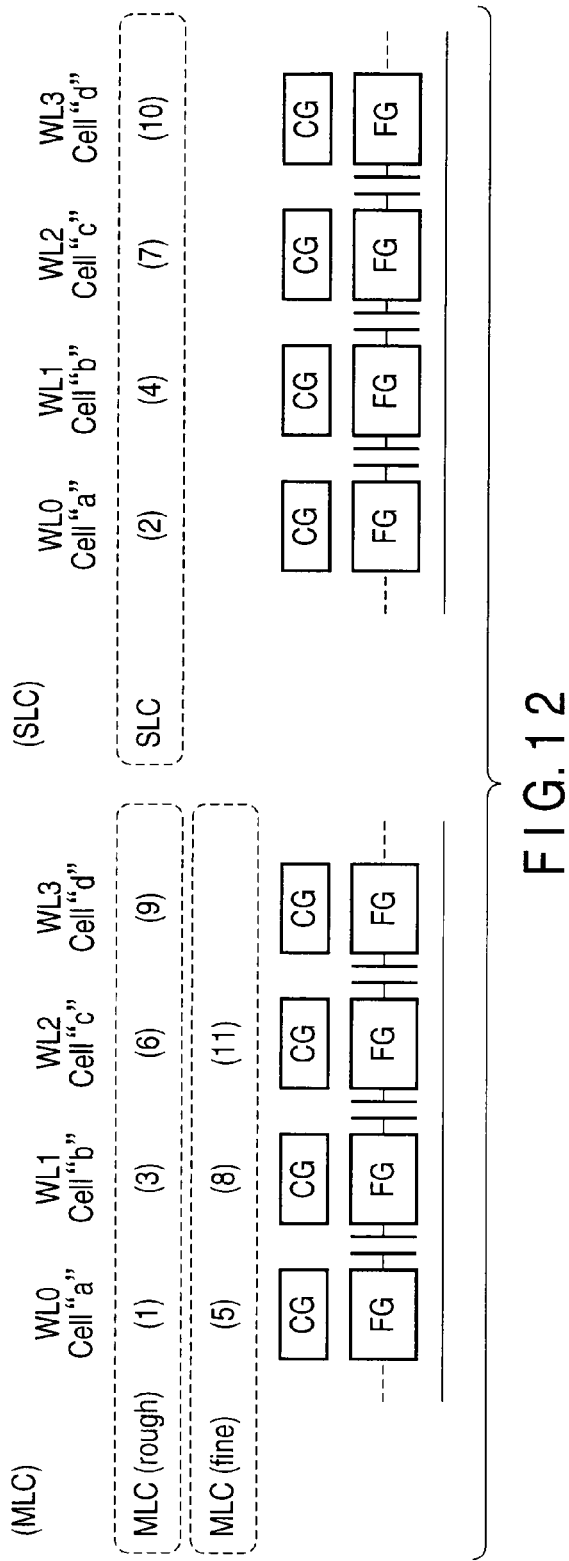
FIG. 12 is a view showing a write operation according to the first embodiment.

FIG. 12 shows a write operation according to the first embodiment. An example of writing 4-level (2 bits) data will now be described. In this embodiment, when writing data in a memory cell in the block MLB, a part of the data is written in a memory cell in the block SLB. In FIG. 12, (1), (2), (3), ... denote the write order for the memory cells in the blocks MLB and SLC. That is, the operation is carried out as follows.

(1) 2-bit data is roughly (sketchily) written in a cell "a" in the block MLB.
(2) Data is written in a cell "a" of the block SLB. This data is data corresponding to exclusive NOR of the 2-bit data written in the cell "a" of the block MLB as will be explained later.
(3) 2-bit data is roughly written into a cell "b" adjacent to the cell "a" of the block MLB.
(4) Data is written in the cell "b" adjacent to the cell "a" of the block SLB. This data is data corresponding to exclusive NOR of the 2-bit data written in the cell "b" of the block MLB.
(5) 2-bit data is finely (accurately) written into the cell "a" of the block MLB.

When such operations are repeated, data is written into each memory cell.

Figure 13:
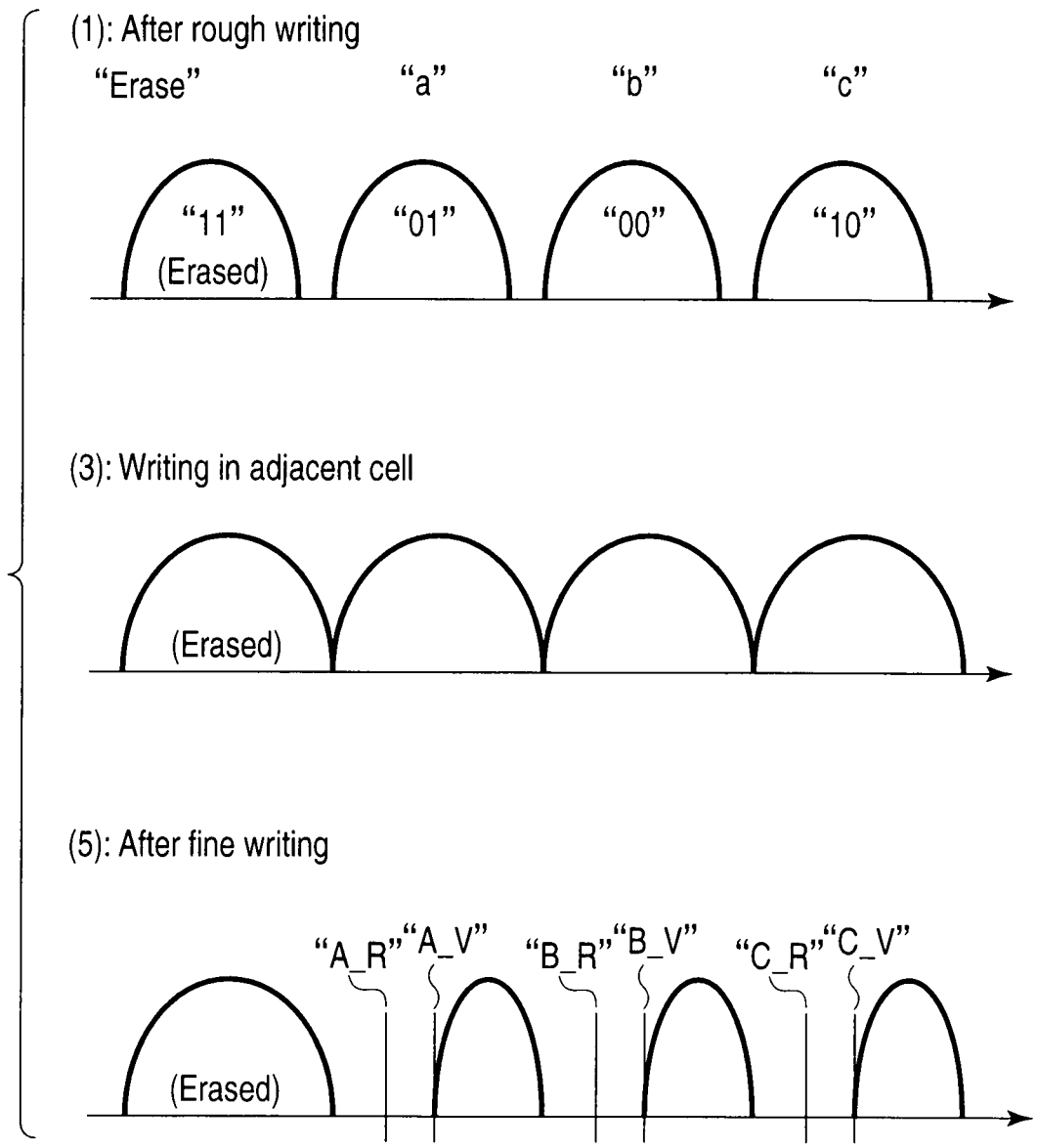
FIG. 13 is a view schematically showing a change in threshold level written into a memory cell in a block MLB as a multilevel region.

FIG. 13 schematically shows a change in threshold level written into a memory cell of the block MLB. In FIG. 13, (1), (3), and (5) are associated with the write order in FIG. 12.

As shown in FIG. 13 (1), data in a memory cell is set to a threshold level "11" by an erase operation. When 2-bit data including a lower page as a first page and an upper page as a second page is written into the memory cell, the memory cell is set to one of threshold levels "01", "00", and "10". This writing is rough, and hence a distribution of each threshold level is wide as compared with a distribution of a target level.

Then, when data is written into an adjacent cell, the threshold level of the memory cell having the data written therein previously is shifted as shown in FIG. 13 (3). At this time, a boundary between respective threshold levels may become unclear in some cases.

Thereafter, the 2-bit data including the lower page and the upper page is again written into the memory cell. Performing this writing enables highly accurately setting of the threshold level of the memory cell as shown in FIG. 13 (5).

Levels "A_R", "B_R", and "C_R" as levels between respective threshold levels are used for reading data. A verify level in a write operation has a value slightly different from a value in a read operation in order to provide a data retention margin. That is, in this embodiment, A_R, B_R, and C_R are used in a read operation, and A_V, B_V, and C_V are utilized in a verify read operation.

(Program Operation)

Figure 14:
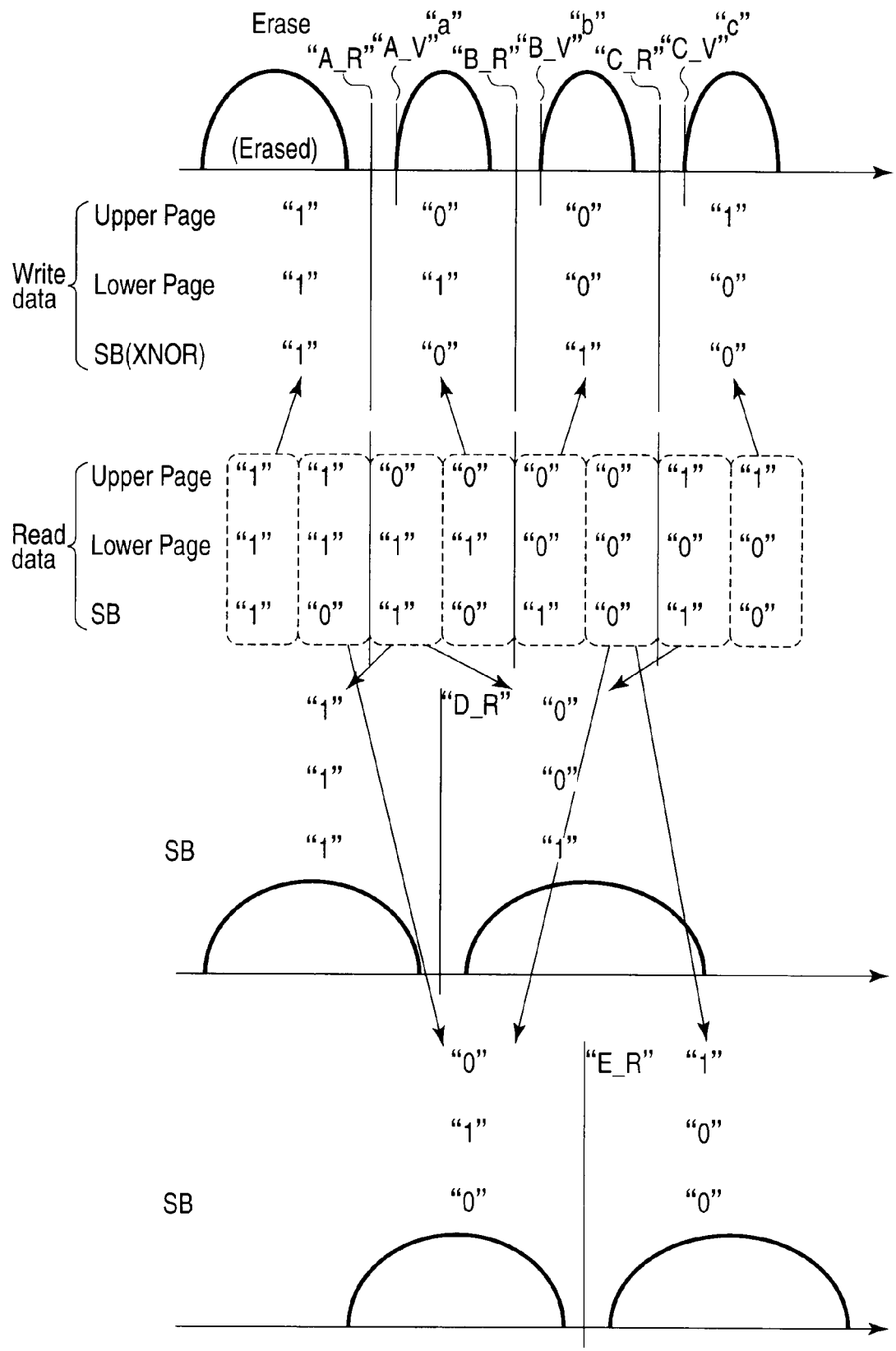
FIG. 14 is a view showing a program operation according to the first embodiment.

FIG. 14 shows a program operation, and FIG. 15 shows a program (write) sequence. In FIG. 15, like reference numerals denote parts equal to those in FIG. 13. Further, numbers "0", "1" ... in "0L", "0U", "1L", "1U" ... designate word lines WL0, WL1 ..., and alphabetic characters "L" and "U" represent a lower page and an upper page, respectively.

(Rough 4-Level Writing and 2-Level Writing in Word Line WL0: (1) and (2) in FIG. 15)

As shown in FIG. 15, a signal Ready/Busy is first set to level H (Ready), and data "0L" of the lower page is loaded to the data latch circuit XDL (which will be simply referred to as XDL hereinafter) by a non-illustrated external controller. Thereafter, the data of the XDL is transferred to the data latch circuit ADL (which will be simply referred to as ADL hereinafter). Subsequently, data of an upper page is loaded to the XDL by the external controller.

Then, the signal Ready/Busy is changed to level L (Busy), and data corresponding to two pages is roughly written into a memory cell connected with one word line WL0 of a selected block MLB as shown in FIG. 13 (1). Subsequently, as shown in FIG. 14, data SB obtained by subjecting the data corresponding to two pages to exclusive NOR (XNOR) is created by the data control unit 10b depicted in FIG. 8. This data SB is written in a selected memory cell in a block SLB.

(Rough 4-Level Writing and 2-Level Writing in Word Line WL1: (3) and (4) in FIG. 15)

Then, the signal Ready/Busy enters a Ready state, and data "1L" and "1U" corresponding to two pages that are to be written into a word line WL1 of the selected block MLB are loaded to the XDL and the ADL from the external controller as explained above.

Thereafter, the signal Ready/Busy enters a Busy state, and the data corresponding to two pages is roughly written into the word line WL1 as shown in FIG. 13 (1). Subsequently, the data corresponding to two pages is subjected to XNOR to create data SB. This data SB is written in a memory cell connected with one word line of the selected block SLB.
(4-Level Data Restoration in Word Line WL0: (RCV) in FIG. 15)

Then, the data written in the memory cell connected with the WL0 of the block MLB is restored by a read operation. However, as shown in FIG. 13 (1), since rough writing reduces a write time, a step-up width of a write voltage is set to a large value. Therefore, a threshold distribution of roughly written four levels is wide. Further, as shown in FIG. 13 (3), an influence of capacitance coupling is given due to writing data in an adjacent cell. Furthermore, the threshold distribution is further widened due to, e.g., spread of the threshold distribution with time, and a threshold distribution of adjacent data overlaps in some cases. Therefore, data in a memory cell cannot be accurately read in some situations. However, data is read by using the read levels "A_R", "B_R", and "C_R" depicted in FIG. 13 (3). The read data is held in the XDL and the ADL.

Subsequently, 2-level data corresponding to the data in the word line WL0 of the block MLB is read from the block SLB. This data SB is held in the data latch circuit BDL (which will be simply referred to as BDL hereinafter).

As shown in FIG. 14, as combinations of the upper page, the lower page, and the data SB in a write operation, there are only four patterns ("1", "1", "0"). However, as shown in FIG. 13 (5), as combinations of data of the upper page and the lower page and the data SB read in a state where threshold distributions overlap, there are eight patterns, i.e., ("1", "1", "1"), ("1", "1", "0"), ("0", "1", "1"), ("0", "1", "0"), ("0", "0", "1"), ("0", "0", "0"), ("1", "0", "1"), and ("1", "0", "0"). In these patterns, since ("1", "1", "1"), ("0", "1", "0"), ("0", "0", "1"), and ("1", "0", "0") are equal to written data, they are recognized as correct data.

Here, consideration will be given to a case where the read upper page, lower page, and data SB are ("0", "1", "1"). Data SB "1" is written in the block SLB. Since a threshold distribution of the block SLB does not overlap, reliability is high. Therefore, the data SB "1" is considered as correct data. Then, a possibility that the upper page, the lower page, and the data SB correspond to one of pieces of data ("1", "1", "1") and ("0", "0", "1") is high.

Thus, as shown in FIG. 14, a level D_R between the read levels A_R and B_R (A_R<D_R<B_R) is used to read data in a memory cell connected with the word line WL0 of the block MLB (soft bit read). As a result, when the read data is present on level A_R side, the upper page, the lower page, and the data SB are determined as ("1", "1", "1"). Moreover, when the read data is present on the read level B_R side, the upper page, the lower page, and the data SB are determined as ("0", "0", "1").

A situation where the upper page, the lower page, and the data SB correspond to ("0", "0", "0") will now be considered. Since the data SB is written in the block SLB, the data SB "0" is of high reliability, and hence it is considered as correct data. Therefore, a possibility that the upper page, the lower page, and the data SB correspond to one of two pieces of data ("0", "1", "0") and ("1", "0", "0") is high.

Therefore, as shown in FIG. 14, a level E_R between the read levels B_R and C_R (B_R<E_R<C_R) is used to read data in a memory cell connected with the word line WL0 of the block MLB (soft bit read). As a result, when the read data is present on the read level B_R side, the upper page, the lower page, and the data SB are determined as ("0", "1", "0"). Additionally, when the read data is present on the read level C_R side, the upper page, the lower page, and the data SB are determined as ("1", "0", "0").

Meanwhile, when the upper page, the lower page, and the data SB correspond to ("1", "1", "0"), the data SB "0" is considered as correct data. Then, the upper page, the lower page, and the data SB are determined as ("0", "1", "0"). Further, when the upper page, the lower page, and the data SB correspond to ("1", "0", "1"), since the data SB "1" is of high reliability, it is considered as correct data. Then, the upper page, the lower page, and the data SB are determined as ("0", "0", "1").

Figure 16:
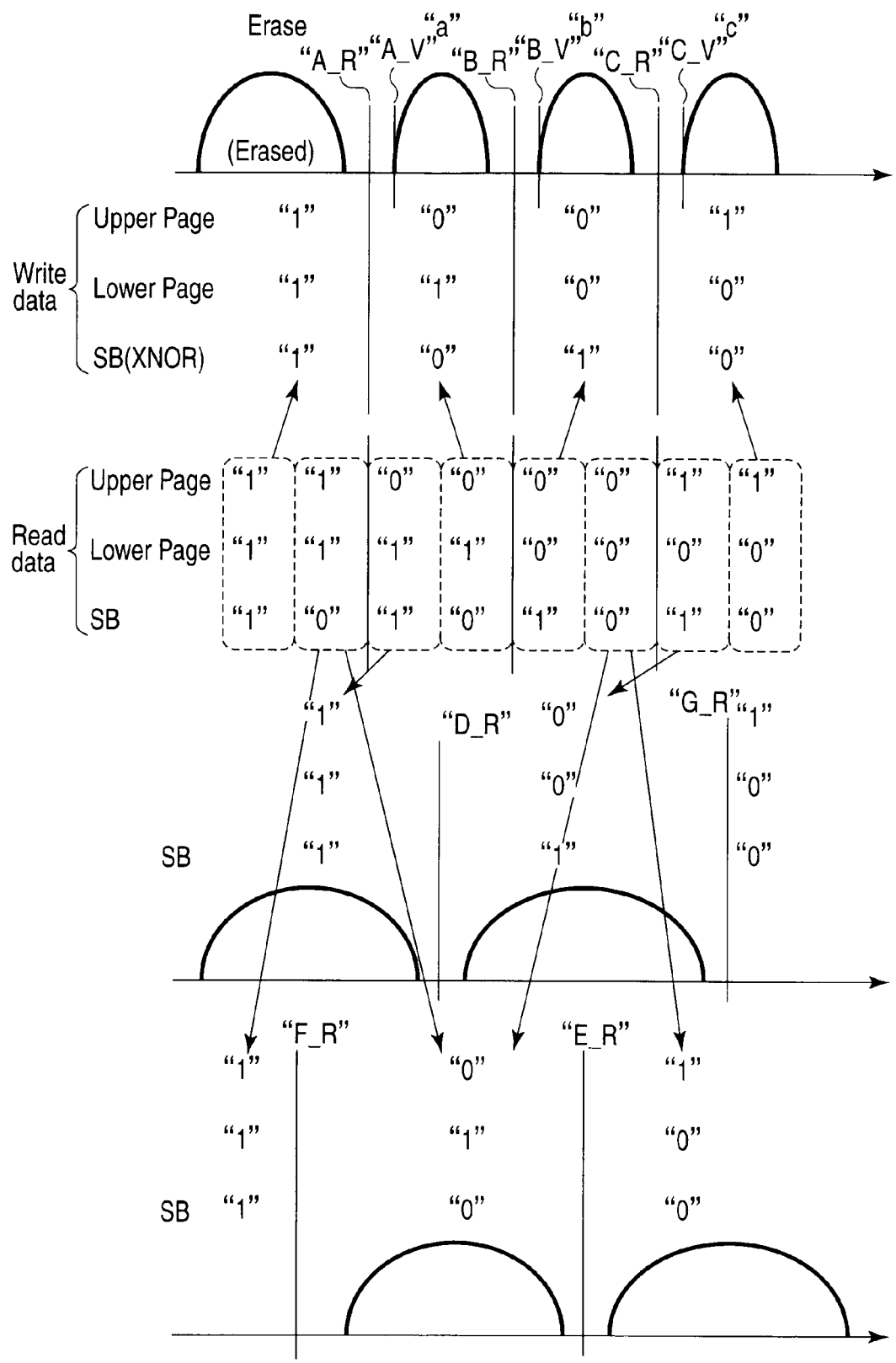
FIG. 16 is a view of a program operation showing a modification of FIG. 14.

FIG. 16 shows a modification of FIG. 14. In the example shown in FIG. 14, the read levels D_R and E_R are used to again read the data. On the other hand, in an example shown in FIG. 16, levels F_R and G_R are further utilized to read data.

In the case of FIG. 14, when the upper page, the lower page, and the data SB read from the memory cell are ("1", "1", "0") or ("1", "0", "1"), the data SB is considered as correct data, and the upper page, the lower page, and the data SB are determined as ("0", "1", "0") or ("0", "0", "1"). However, in FIG. 16, when the upper page, the lower page, and the data SB read from the memory cell are ("1", "1", "0"), the read level F_R (F_R<A_R) is used to read data in the memory cell connected with the word line WL0 of the block MLB (soft bit read). As a result, when the read data is present on the read level A_R side, the upper page, the lower page, and the data SB are determined as ("0", "1", "0"). Furthermore, when the read data is present on the side lower than the read level F_R, the upper page, the lower page, and the data SB are determined as ("1", "1", "1"). Moreover, when the upper page, the lower page, and the data SB read from the memory cell correspond to ("1", "0", "1"), the read level G_R (C_R<G_R) is used to read data in the memory cell connected with the word line WL0 of the block MLB (soft bit read). As a result, when the read data is preset on the read level C_R side, the upper page, the lower page, and the data SB are determined as ("0", "0", "1"). Additionally, when the read data is present on the side higher than the read level G_R, the upper page, the lower page, and the data SB are determined as ("1", "0", "0").

Particulars of a data restoring operation will be explained later.
(4-Level Fine Writing in Word Line WL0: (5) in FIG. 15)

As explained above, fine writing is carried out with respect to a memory cell of the block MLB based on restored data corresponding to two pages as shown in FIG. 13 (5). In this fine writing, as a verify level, A_V, B_V, or C_V associated with a target threshold level is used. A step-up width of a write voltage is set to be smaller than a step-up width of a write voltage that is used in rough writing. Adopting such settings enables obtaining a threshold distribution that is narrow in regard to the target threshold level.
(4-level Rough Writing and 2-level Writing in Word Line WL2: (6) and (7) in FIG. 15)

Then, as shown in FIG. 14, data corresponding to two pages that is to be written into the word line WL2 is loaded into the XDL and the ADL from the external controller. As shown in FIG. 13 (1), 4-level data is roughly written into a memory cell in a selected block MLB. Thereafter, data SB obtained by subjecting the data corresponding to two pages to XNOR is written into a memory cell of a selected block SLB.
(Restoration of 4-Level Data in Word Line WL1: (RCV) in FIG. 15)

4-level data corresponding to two pages in the word line WL1 is restored by the read operation for the data SB and a soft bit like the word line WL0.

(4-Level Fine Writing in Word Line WL1: (8) in FIG. 15)

Like the word like WL1, 4-level data is finely written based on the restored data corresponding to two pages in the word line WL1.

A specific operation of restoring the 4-level data read from the block MLB will now be described.

(Cell→Sense Amplifier Unit)

In a data read operation, a signal RST of the sense amplifier unit 10a depicted in FIG. 7 is first set to level H, a signal INV of the latch circuit 32 is set to level L, and a signal LAT is set to level H. Then, a read voltage is supplied to a selected word line, and a voltage Vread is supplied to a non-selected word line. Furthermore, signals BLS, BLC, BLX, XXL, and HLL of the select gates S1 and S2 and the sense amplifier unit 10a in the memory cell array are set to level H, thereby charging the bit line BL. At the same time, Node of the capacitor 33 is charged to Vdd. Then, Node has a voltage Vdd. When a threshold voltage of the memory cell is lower than the voltage of the selected word line, the memory cell is turned on. When the threshold voltage is higher than the voltage of the selected word line, the memory cell is turned off. In this state, after setting the signal HLL to level L, when a signal CLK is changed from level L to level H, the voltage at Node becomes a potential which is as high as approximately 2 Vdd. However, when the memory cell is OFF, this state is maintained. On the other hand, when the memory cell is ON, the voltage at Node is reduced.

Here, after again changing the signal CLK to level L from level H, when a signal STB is set to level L, since Node is at level H if the cell is OFF, the PMOS 29 is turned off, and the signal INV of the latch circuit 32 is maintained at level L. Moreover, when the cell is ON, since Node is at level L, the PMOS 29 is turned on, and the signal INV of the latch circuit 32 is changed to level H. Since data of the signal LAT is an inversion signal of the signal INV, the signal LAT is at level L when the cell is ON, and the signal LAT is at level H when the cell is OFF.

(Sense Amplifier Unit→Data Control Unit)

The data of the signal LAT of the latch circuit 32 is transferred to the data control unit 10b. At this time, a signal SET depicted in FIG. 8 is first set to level H, and a signal FAIL is set to level L. Therefore, a signal MTCH is set to level H.

Here, when a signal NCO depicted in FIG. 7 is set to level H, a signal COND shown in FIG. 8 is set to level L, and a signal CONS is set to level H, data of the sense amplifier unit 10a is transferred to the IBUS through the transfer gate 42. Thereafter, a signal IFL is temporarily set to level H. Then, when the signal LAT (the IBUS) is at level L, since the NMOS 56 is OFF, the signal MTCH is maintained at level H. Additionally, when the signal LAT (the IBUS) is at level H, the NMOS 56 is turned on, and hence the signal MTCH is changed to level L.

Subsequently, the signal COND is changed to level H and the signal CONS is changed to level L to close the transfer gate 42 and open the transfer gate 43, and subsequently a signal F2L is set to level H and a signal M2HB is set to level L. Then, the DBUS is changed with the data of the signal MTCH. Here, when a signal BLCA is set to level H and a signal BLCA_B is set to level L, data of the signal MTCH is latched to the ADL. That is, the ADL is set to level H when the memory cell is ON, and the ADL is set to level L when the memory cell is OFF.

(Multilevel Data Reading)

Figure 17:
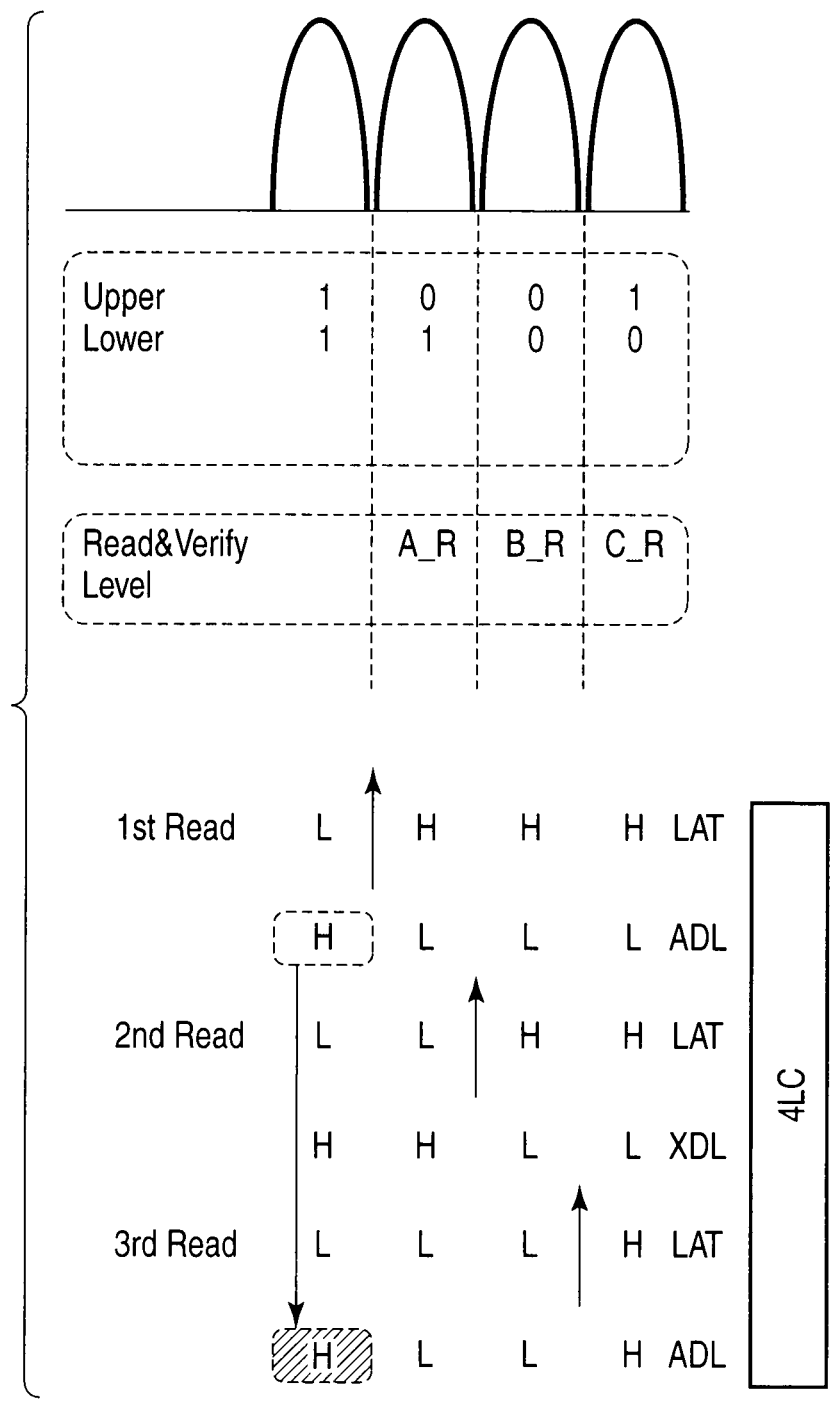
FIG. 17 is a view showing a data restoring operation.

FIG. 17 shows a relationship between multilevel threshold levels and data latched in the XDL and the ADL. Data is first read from a memory cell of the block MLB based on a read level A_R. When a threshold voltage of the cell is lower than A_R, the cell is turned on. Therefore, the ADL is set to level H. When the threshold voltage of the cell is higher than A_R, the cell is turned off. Therefore, the ADL is set to level L.

After reading by a read level B_R, and when a threshold voltage of the cell is lower than B_R, the XDL is set to level H. When the threshold voltage of the cell is higher than B_R, the XDL is set to level L. In such a manner, data of the lower page is latched in the XDL.

Then, after reading by a read level C_R, and when a threshold voltage of the cell is lower than B_R, the cell is turned on, and the signal LAT is set to level L. When the threshold voltage of the cell is higher than C_R, the cell is turned of, and the signal LAT is set to level H.

In this state, the signal SET of the data control unit 10b shown in FIG. 8 is set to level H. As a result, the signal FAIL is set to level L and the signal MTCH is set to level H. At this time, the signals NCO, COND and CONS are set to levels H, L and H, respectively, whereby the data latched by the latch circuit 32 of the sense amplifier unit 10a is transferred to the IBUS. After that, the signal IFL is once set to level H. At this time, if the signal LAT is at level L, the signal MTCH is kept at level H, whereas if the signal LAT is at level H, the signal MTCH is set to level L.

After the signals COND and CONS are set to levels H and L, respectively, the signals F2L and M2HB are set to levels H and L, respectively. At this time, if the signal MTCH is at level H, the signal DBUS is charged with Vdd (level H), whereas if the signal MTCH is at level L, the signal DBUS is charged with Vss (level L). In this state, the signal BLCA_B is kept at level L, and only the PCH side of the transfer gate 65 of the ADL is turned on. At this time, only when the signal MTCH is set at level H, the data of the ADL is forcedly set to level H.

(Binary Data Reading)

Figure 18:
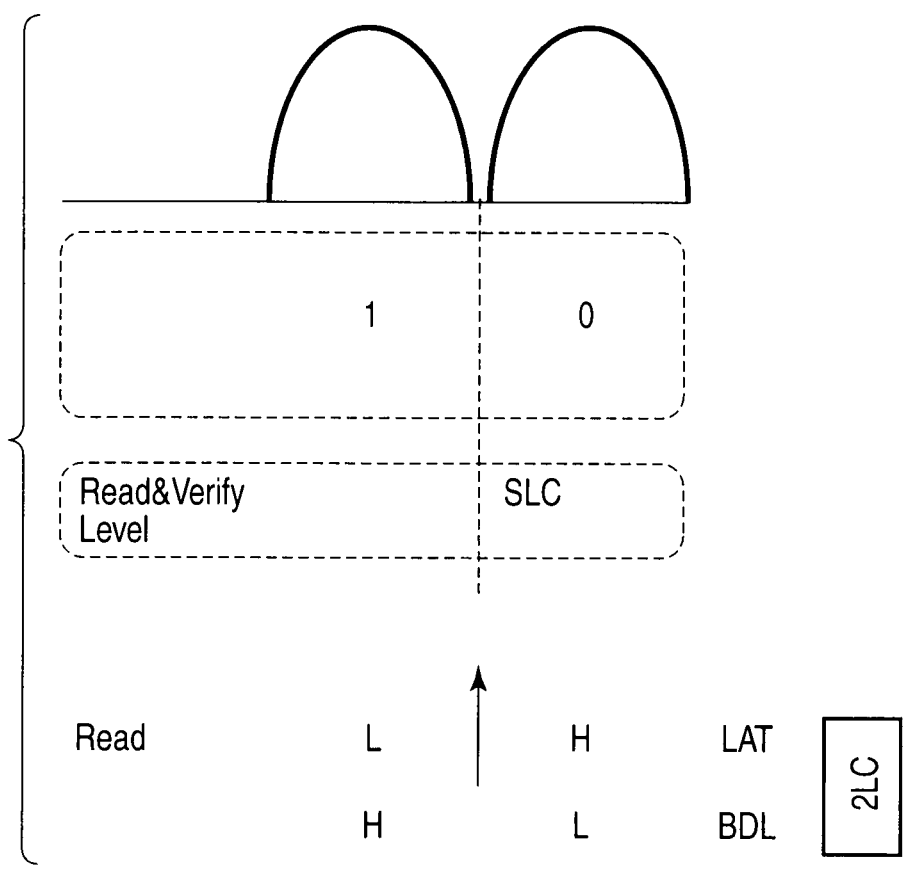
FIG. 18 is a view showing the data restoring operation.

FIG. 18 shows the relationship between a binary-data threshold level and the data latched by the BDL. In the same way as multilevel data reading, data SB is read from each memory cell of the block SLB. This data is held by the BDL.

(Data Operation 1)

Assuming, for example, that the data items in the ADL (upper page), XDL (lower page) and BDL (SB) are ("1", "1", "0"), respectively, a description will be given of the operation of converting the upper page data, the lower page data and the SB data into ("1", "1", "1"), respectively.

The upper page data, the lower page data and the SB data read from the memory cells of the blocks MLB and SLB are latched by the ADL, XDL and BDL, respectively.

First, the signal SET of the data control unit 10 shown in FIG. 8 is set to level H, and a signal MACH is set to level H. Subsequently, the signal COND is set to level H and the signal CONS is set to level L, then the signal BLCA is set to level H, and data of the ADL is transferred to the DBUS and the IBUS. Here, when a signal IFH is set to level H, the signal MTCH is changed to level L if the ADL is "0", and the signal MTCH is maintained at level H if the ADL is at level H.

Then, a signal BLCX is set to level H, and the data of the XDL is transferred to the DBUS and the IBUS. Here, when the signal IFH is set to level H, the signal MTCH is changed to level L if the XDL is "0", and the signal MTCH is maintained at level H if the ADL is "1".

Subsequently, a signal BLCB is set to level H, and data of the BDL is transferred to the DBUS and the IBUS. Here, when the signal IFL is set to level H, the signal MTCH is changed to level H if the XDL is "1", and the signal MTCH is maintained at level H if the XDL is "0". Therefore, the signal MTCH is set to level H only in a case where the ADL (the upper page) is "1", the XDL (the lower page) is "1" and the BDL (the SB) is "0", and the signal MTCH is set to level L in any other cases.

Here, the signal F2L is set to level H, and the signal M2HB is set to level L. Then, the IBUS and the DBUS are set to level H when the signal MTCH is at level H, and the IBUS and the DBUS are set to level L when the signal MTCH is at level L. In this state, a signal BLCB_B is set to level L, and a PCH side alone of the transfer gate 65 of the BDL is turned on. Then, data of the BDL is forcibly changed to level H only when data of each of the IBUS and the DBUS is at level H. Based on this operation, when the ADL (the upper page) is "1", the XDL (the lower page) is "1" and the BDL (the SB) is "0", the ADL (the upper page) is set to "1", the XDL (the lower page) is set to "1", and the BDL (the SB) is set to "1".

(Data Operation 2)

For example, a description will be given as to an operation of converting respective pieces data of the upper page, the lower page, and the SB into ("0", "1", "0") or ("1", "0", "0") when respective pieces of data of the ADL (the upper page), the XDL (the lower page), and the BDL (the SB) are ("0", "0", "0").

In this case, a selected word line is set to a read level E_R, and data is read from the memory cell of the block MLB as in the above example. As a result, when a threshold level of the cell is lower than E_R, the cell is turned on, and the signal LAT of the latch circuit 32 is set to level L. Further, when the threshold level of the cell is higher than E_R, the cell is turned off. Therefore, the signal LAT of the latch circuit 32 is set to level H.

(Operation of Converting Data of Upper Page, Lower Page, and SB into ("0", "1", "0") when Data of Upper Page, Lower Page, SB is ("0", "0", "0") and Threshold Level of Cell is Lower Than E_R)

While reading data from a memory cell, the signal MTCH is set to level H only when data of the upper page, the lower page, and the SB is ("0", "0", "0") based on the same operation as the data operation of converting data ("1", "1", "0") of the upper page, the lower page, and the SB into ("1", "1", "1"), and the signal MTCH is set to level L in any other case.

After the data in the memory cell is read to the signal LAT, the signal NCO is set to level H, the signal COND is set to level L, the signal CONS is set to level H, and the signal IFL is set to level H. Then, the signal MTCH is changed to level L when the signal LAT is at level H, and the signal MTCH is maintained at level H when the signal LAT is at level L. That is, the signal MTCH is set to level H only when the data of the upper page, the lower page, and the SB is ("0", "0", "0") and a threshold value of the cell is lower than E_R, and the threshold value is set to level L in any other case.

Here, it is assumed that the signal COND is set to level H, the signal CONS is set to level L, the signal F2L is set to level H, and the signal M2HB is set to level L. Then, the IBUS and the DBUS are set to level H when the signal MTCH is at level H. Further, the IBUS and the DBUS are set to level L when the signal MTCH is at level L. Thereafter, the signal BLCX=L is set, and the PCH side alone of the transfer gate 65 of the XDL is turned on. Then, data of the XDL is forcibly set to level H only when the data of each of the IBUS and the DBUS is at level H. Based on this operation, the ADL (the upper page), the XDL (the lower page), and the BDL (the SB) are set to ("0", "1", "0") when the ADL (the upper page), the XDL (the lower page), and the BDL (the SB) correspond to ("0", "0", "0") and the threshold level of the cell is lower than E_R.

(Operation of Converting Data of Upper Page, Lower Page, and SB into ("1", "0", "0") when Data of Upper Page, Lower Page, and SB Correspond to ("0", "0", "0") and Threshold Level of Cell is Higher Than E_R)

Like the operation of setting data of the upper page, the lower page, and the SB to ("0", "1", "0") when the data of the upper page, the lower page, and the SB is ("0", "0", "0") and a threshold level of a cell is lower than E_R, data of the ADL (the upper page), the XDL (the lower page), and the BDL (the SB) is set to ("1", "0", "0") when the data of the ADL (the upper page), the XDL (the lower page), the BDL (the SB) is ("0", "0", "0") and a threshold level of the cell is higher than E_R.

(Operation of Converting Data of Upper Page, Lower Page, and SB into ("0", "0", "1") when Data of ADL (Upper Page), XDL (Lower Page), and BDL (SB) is ("1", "0", "1"))

This operation is the same as the operation of converting data of the upper page, the lower page, and the SB into ("0", "1", "0") when the data of the ADL (the upper page), the XDL (the lower page), and the BDL (the SB) is ("1", "1", "0")

(Operation of Converting Data of Upper Page, Lower Page, and SB into ("1", "1", "1") or ("0", "0", "1") when Data of ADL (Upper Page), XDL (Lower Page), and BDL (SB) is ("0", "1", "1"))

This operation is the same as the operation of converting data of the upper page, the lower page, and the SB into ("0", "1", "0") or ("1", "0", "0") when the data of the ADL (the upper page), the XDL (the lower page), and the BDL (the SB) is ("0", "0", "0").

However, when a read level is D_R and a threshold level of the cell is lower than the read level D_R, data of the upper page, the lower page, and the SB is set to ("1", "1", "1"). When the threshold level is higher than the read level D_R, the data of the upper page, the lower page, and the SB is set to ("0", "0", "1").

In a case where data of each of the IBUS and the DBUS is at level H, signals BLCA_B=L, BLCX_B=L, and BLCB_B=L are set and the PCH side alone of the transfer gate 65 is turned on when forcibly setting data of the ADL, the XDL, and the BDL to level H.

Further, in a case where data of each of the IBUS and the DBUS is at level L, signals BLCA=H, BLCX=H, and BLCB=H are set and the NCH side alone of the transfer gate 65 is turned on when forcibly setting data of the ADL, the XDL, and the BDL to level L.

(Read Operation)

As shown in FIG. 13 (5), when reading data from a 4-level memory cell in which data has been finely written at a threshold level as a target level, read levels A_R, B_R, and C_R are utilized. The data read from the memory cell is transferred to the XDL or the ADL shown in FIG. 8 to be output to the outside from the XDL.

Further, when reading data from a memory cell in a write operation in which fine writing depicted in FIG. 13 (5) is not performed, the same operation as the read operation of restoring 4-level data corresponding to two pages is carried out during the writing. That is, when data read from the memory cell of the block MLB as a 4-level region at the read level A_R, B_R, or C_R and data read from the memory cell of the block SLB as a 2-level region are not correct, they are corrected by using data read from the memory cell of the block MLB at the read level E_R or F_R. The corrected data is transferred to the XDL or the ADL to be output to the outside.

According to the first embodiment, when the block MLB as a multilevel region and the block SLB as a 2-level region are provided to store 4-level data in memory cells, the 4-level data is first roughly written into the block MLB, binary data of 1 bit generated from 2 bits in the 4-level data is written into the block SLB, and this data of 1 bit and the rough 4-level data are read out. If the respective pieces of read data are not correct, the read level is changed to read data from the 4-level cell, this read data is used to restore the original 4-level data, and the restored data is finely written at a target threshold level. Therefore, a total write time including a write time for the block MLB and a write time for the block SLB can be reduced.

Furthermore, in regard to the number of bits to be written into the block SLB, bits corresponding to two pages, i.e., the lower page and the upper pages are required, bits corresponding to binary data generated from the lower page and the upper page can suffice. Therefore, a storage capacity of the block SLB can be reduced to ½.

Figure 19:
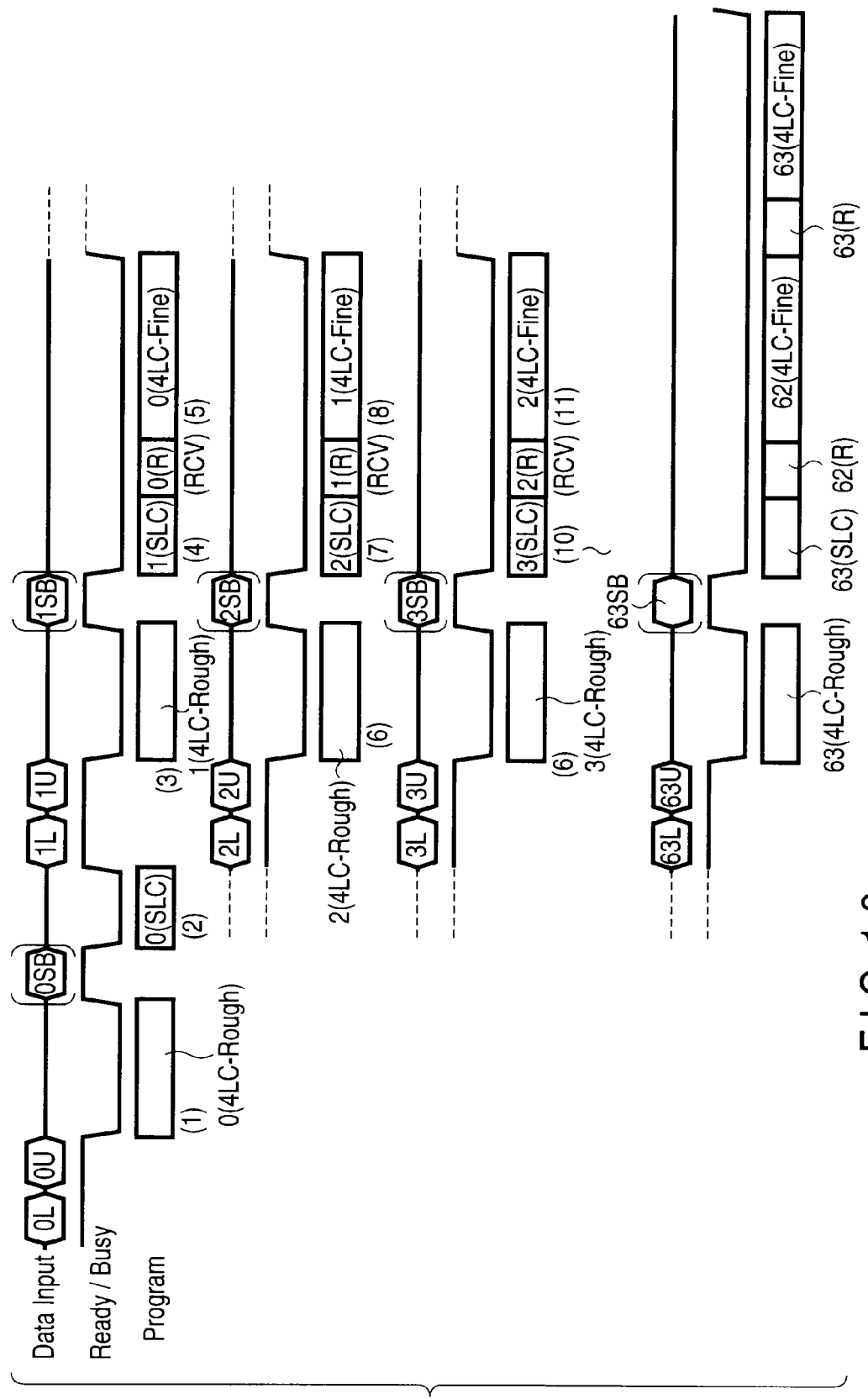
FIG. 19 is a timing chart showing a first modification of the write sequence depicted in FIG. 15.

FIG. 19 is a first modification of the write sequence depicted in FIG. 15. In the write sequence shown in FIG. 15, 2-level writing is carried out after 4-level rough writing with the signal Ready/Busy being set to Busy. On the other hand, in the modification depicted in FIG. 19, after 4-level rough writing, the signal Ready/Busy is temporarily set to Ready and then data is written into a memory cell of the block SLB. Address input control is executed by the external controller. It is to be noted that data "SB" that is to be written into the block SLB can be generated by the controller, and the data can be input from the outside to be written into a memory cell of the block SLB.

Figure 20:
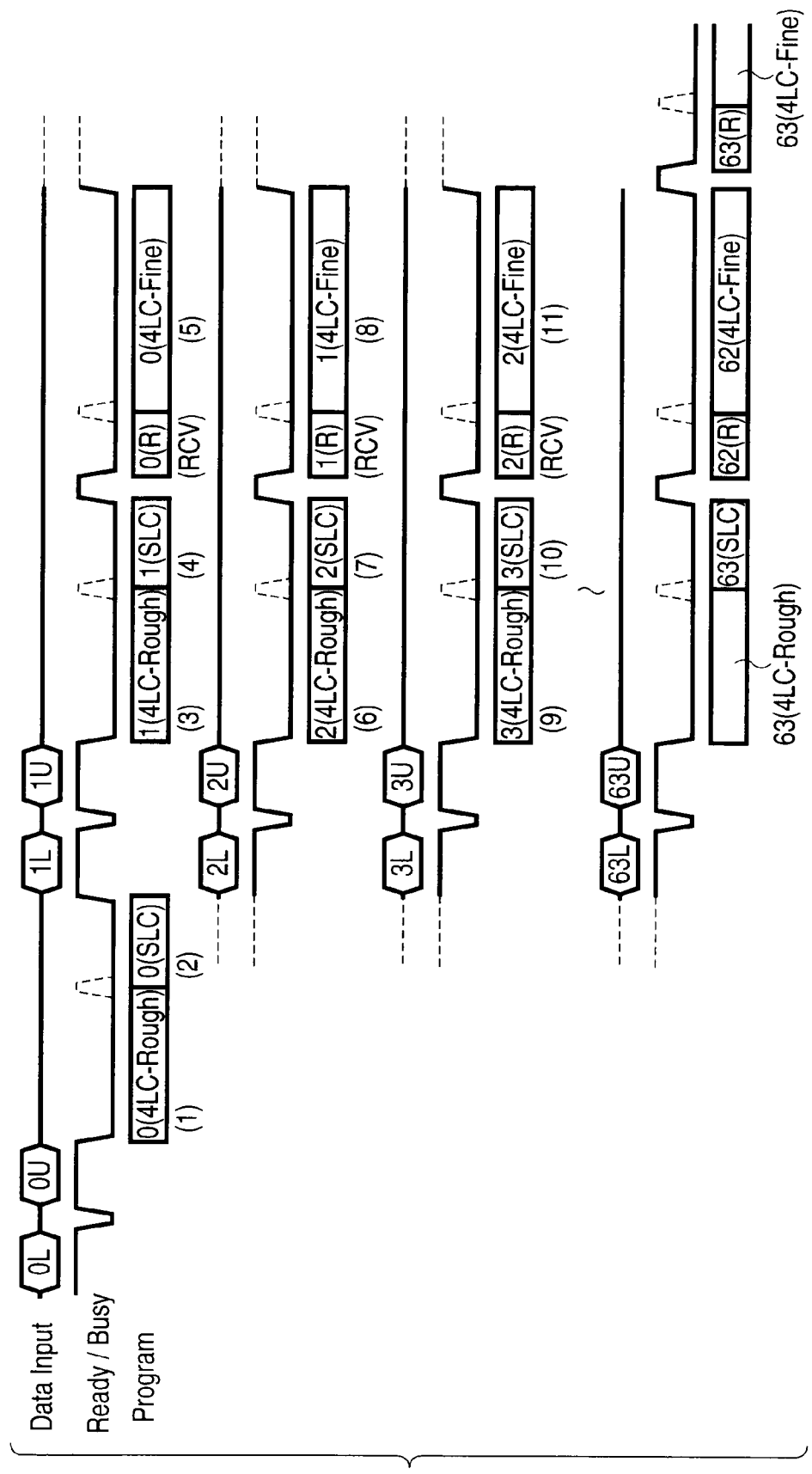
FIG. 20 is a timing chart showing a second modification of the write sequence.

FIG. 20 shows a modification of the write sequence. In the examples depicted in FIGS. 15 and 19, the 4-level data is restored after writing in the block SLB. On the other hand, in the example shown in FIG. 20, after writing in the block SLB, the signal Ready/Busy may be temporarily set to the Ready state to input an address. Moreover, although 4-level fine writing is continuously effected after 4-level data restoration, the signal Ready/Busy may be temporarily set to the Ready state to input an address from the external controller as indicated by a broken line.

Like the first and second modifications, when an address required for the next write operation is input during writing, since a latch circuit that holds the address for the next write operation can be eliminated in the NAND flash memory, the structure can be simplified.

Second Embodiment

FIG. 21 shows a write sequence according to a second embodiment. In the first embodiment, reading and restoration of 4-level data are executed after writing in the block SLB in an adjacent cell. On the other hand, in the second embodiment, reading and restoration of 4-level data are carried out before rough writing of 4-level data with respect to an adjacent cell. Since reading 4-level data is effected before writing in an adjacent cell, the 4-level data is not affected by capacitance coupling due to writing in the adjacent cell. Therefore, a threshold distribution is shifted as shown in FIG. 13 (3) to widen a read margin. However, in this case, read 2-level data must be held. Accordingly, in the data control unit 10b shown in FIG. 8, two more data latch circuits must be additionally provided. That is, the data latch circuits are ADL, BDL, and XDL in the first embodiment, but circuits CDL and DDL are further required.

A flow of a (program) in this example is as follows.
(1) 4-level data is roughly written in a memory cell connected with a word line WL0 of a block MLB, and 2-level data is written in a memory cell of a block SLB associated with the memory cell connected with the word line WL0 of the block MLB (FIG. 21 (1) and (2)), (2) The 4-level data written in the memory cell connected with the word line WL0 of the block MLB is restored (2-level read & soft bit read) (FIG. 21 (RCV)).
(3) The 4-level data is roughly written into a memory cell connected with a word line WL1 of the block MLB, and the 2-level data is written in a memory cell in the block SLB associated with the memory cell connected with the word line WL1 of the block MLB (FIG. 21 (3) (4)).
(4) The 4-level data is finely written into the memory cell connected with the word line WL0 in the block MLB (FIG. 21 (5)).
(5) The 4-level data written in the memory cell connected with the word line WL1 in the block MLB is restored (2-level read & soft bit read) (FIG. 21 (RCV)).
(6) The 4-level data is roughly written into a memory cell connected with a word line WL2 in the block MLB, and the 2-level data is written into a memory cell in the block SLB associated with the memory cell connected with the word line WL2 in the block MLB (FIG. 21 (6) (7)).
(7) The 4-level data is finely written in the memory cell connected with the word line WL1 in the block MLB (FIG. 21 (8)).

According to the second embodiment, data in a memory cell in the block MLB in which writing is executed previously is read before data is written into an adjacent cell. Therefore, an influence of capacitance coupling is small, and data can be accurately restored. Additionally, as a time required for restoration can be reduced, a total write time can be decreased.

Third Embodiment

Figure 22:
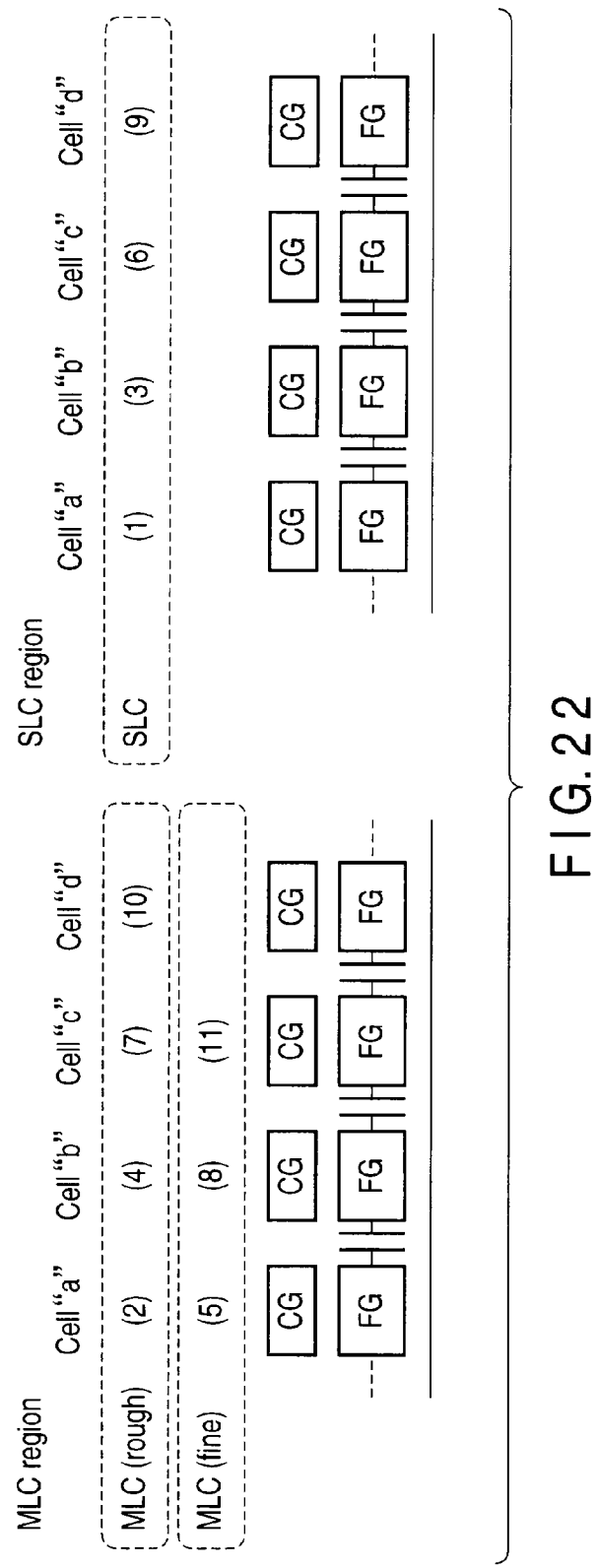
FIG. 22 is a view showing a write order according to a third embodiment.
Figure 23:
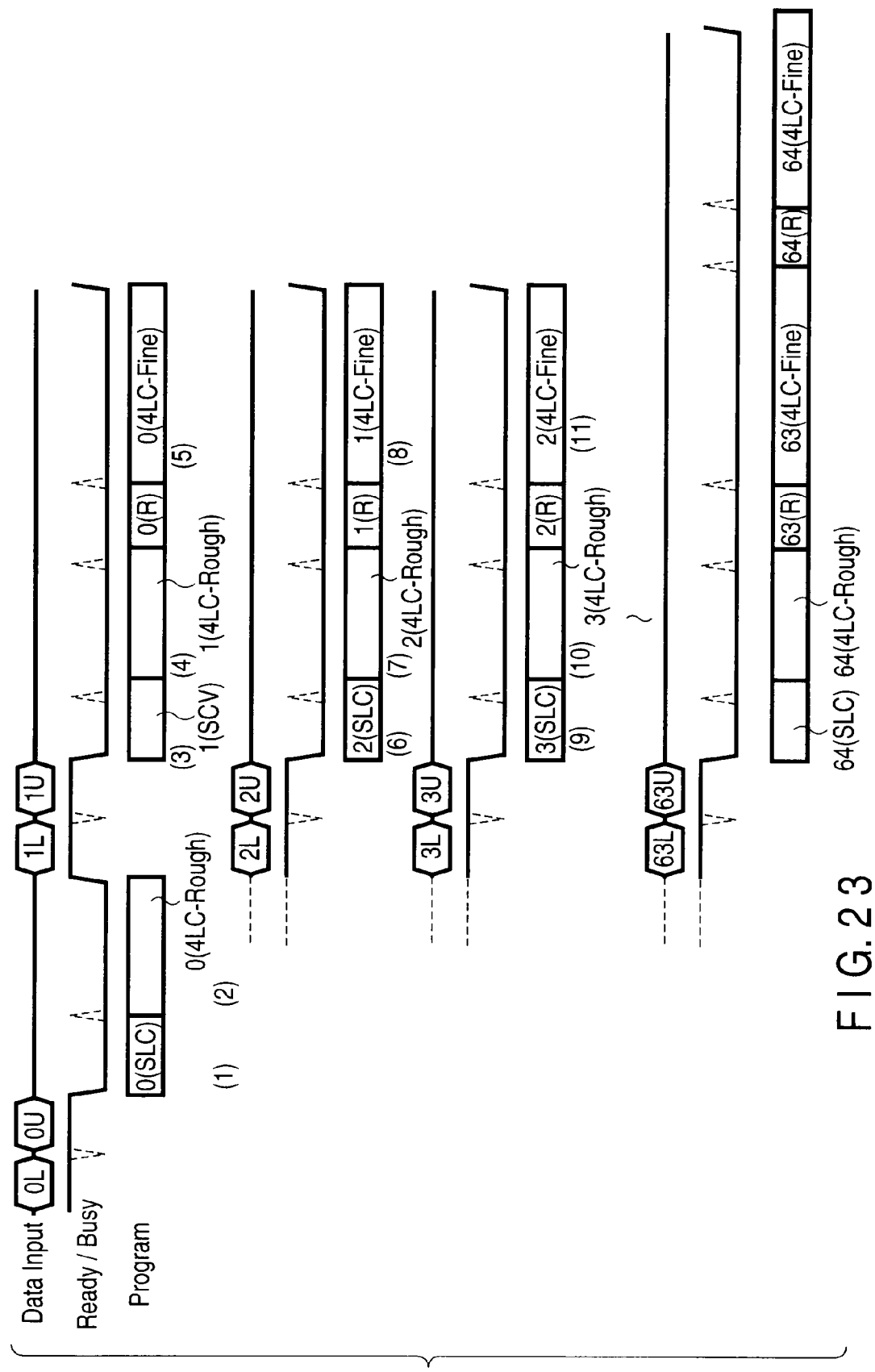
FIG. 23 is a timing chart showing a write sequence according to the third embodiment.

FIGS. 22 and 23 show a third embodiment. In the first and second embodiments, 4-level data is roughly written in a memory cell of the block MLB, and then 2-level data is written in a memory cell of the block SLB. On the other hand, a third embodiment is characterized in that 2-level data is first written into a memory cell of the block SLB, and then 4-level data is roughly written in a memory cell of the block MLB. In the third embodiment, a write operation is the same as those in the first and second embodiments, thereby omitting a description thereof.

The third embodiment can also obtain the same effect as those in the first and second embodiments.

Figure 24:
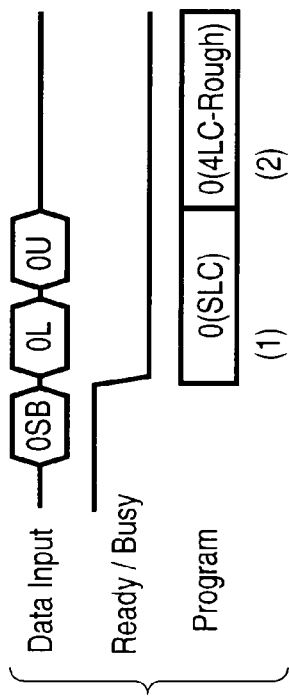
FIG. 24 is a timing chart showing a modification of the third embodiment.

FIG. 24 shows a modification of the third embodiment. When generating data obtained by subjecting data corresponding to two pages to exclusive NOR in a controller, the controller first supplies an address of the block SLB and data of exclusive NOR to a NAND flash memory. Thereafter, writing in the block SLB is first carried out (FIG. 24 (1)). During this writing in the block SLB, respective pieces of write data "0L" and "0U" in a memory cell connected with a word line WL0 in the block MLB are loaded to XDL and ADL from the controller. Subsequently, 4-level data is roughly written in the memory cell connected with the word line WL0 into the block MLB (FIG. 24 (2)).

According to this modification, since data in the block MLB can be loaded to the XDL and the ADL during writing in the block SLBA, a data load time can be reduced, and a total write time can be decreased.

Fourth Embodiment

Figure 25:
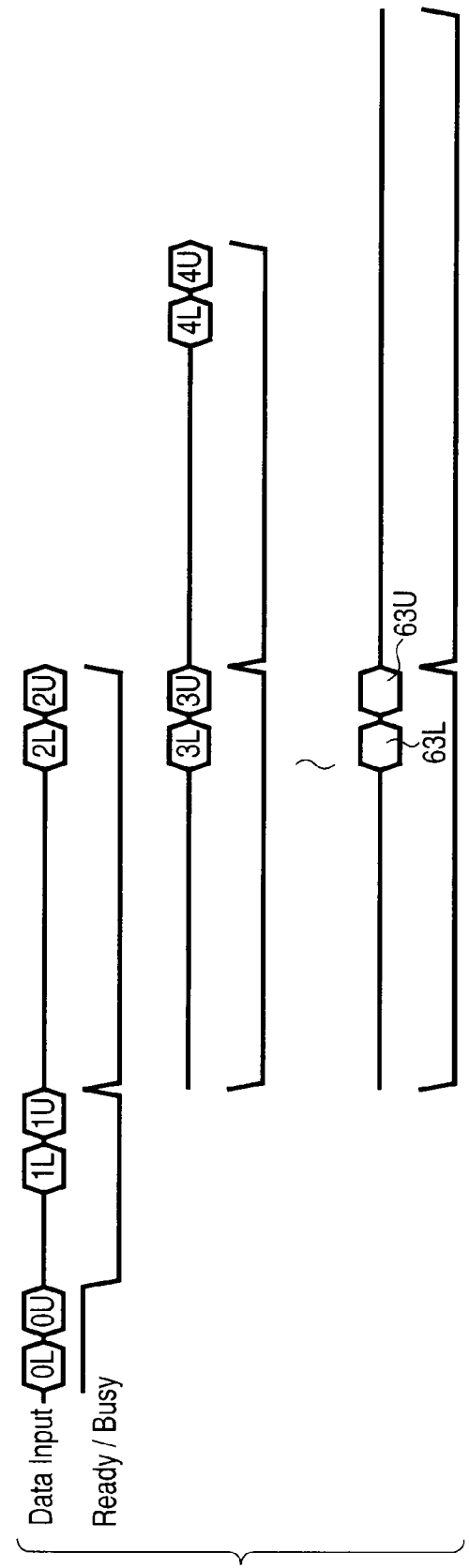
FIG. 25 is a timing chart showing a fourth embodiment.

FIG. 25 shows a fourth embodiment. According to the fourth embodiment, when one or more data latch circuits in the data latch circuits ADL, BDL, and XDL in the data control unit depicted in FIG. 8 are no longer required for writing, the data latch circuits are used as caches for writing the next data.

For example, in a Busy state of a signal Ready/Busy, i.e., in a write state of a block MLB or SLB, when a data latch circuit is not occupied, the next write data is loaded to this unoccupied data latch circuit from an external controller.

According to the fourth embodiment, since the next data can be loaded in parallel to writing, a speed for writing can be increased.

A write sequence of the fourth embodiment can be applied to all of the first, second, and third embodiments.

Although data to be stored in a 2-level region is not corrected based on ECC, ECC may be used to further improve reliability.

Fifth Embodiment

In each of the foregoing embodiments, address control over the block SLB is executed by the controller connected to the outside of the NAND flash memory as a semiconductor memory device. On the other hand, in a fifth embodiment, the same function as the external controller is provided in the NAND flash memory.

Figure 26A:
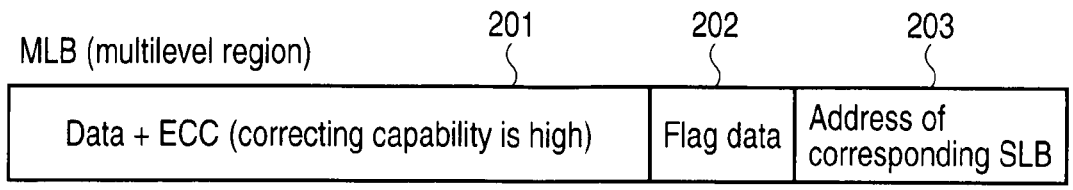
FIGS. 26A and 26B are views showing an assignment mode for data in a page applied to a fifth embodiment.

FIG. 26 shows an assignment mode for data in a page applied to the fifth embodiment. FIG. 26A shows assignment of data in a page of a block MLB as a multilevel region. As shown in FIG. 26A, the page of the block MLB includes a storage region 201 for data and an ECC (error correction code) data, a storage region 202 for flag data indicative of whether fine writing is completed, and a storage region 203 for a page address of a block SLB associated with the block MLB. Data SB associated with rough write data is written in the block SLB after rough writing and before fine writing. Therefore, when a page address of the block SLB is stored in a corresponding page of the block MLB, a correspondence relationship of the block MLB and the block SLB can be stored in the NAND flash memory.

Figure 26B:
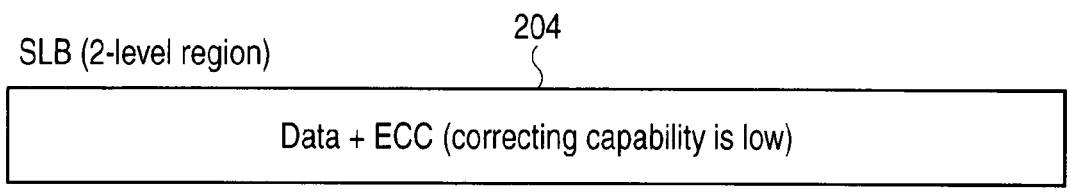

FIG. 26B shows assignment of data in a page of the block SLB as 2-level region. The page of the block SLB is formed of data. However, it may include ECC data. The data of the block SLB is 2-level data, and an error is hardly generated therefrom. Therefore, a correcting capability for the ECC data in the block SLB may be set to be lower than that of ECC data in the block MLB.

Figure 27:
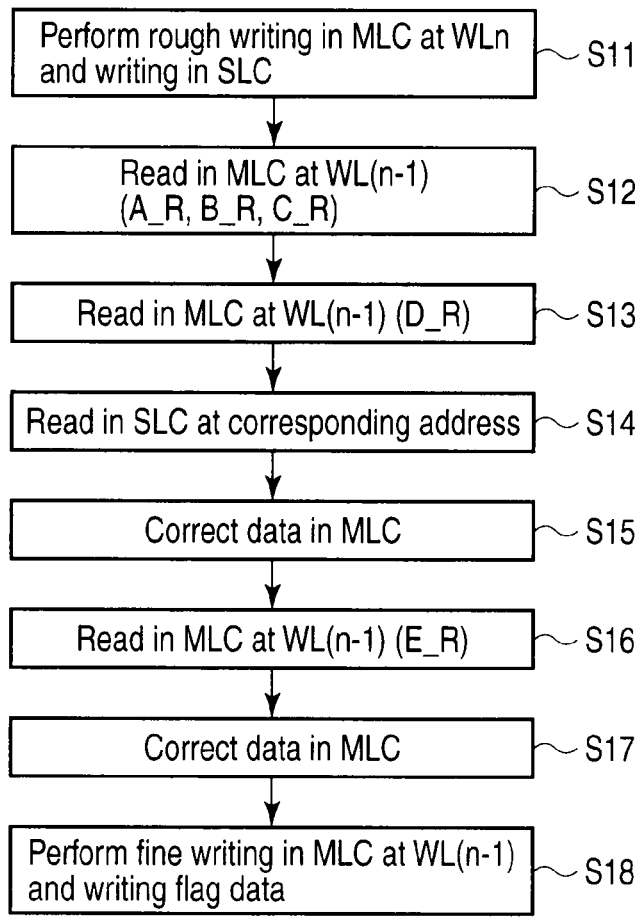
FIG. 27 is a flowchart showing a write operation according to the fifth embodiment.

FIG. 27 is a flowchart showing a write operation according to the fifth embodiment. A write operation according to the fifth embodiment will now be described with reference to FIG. 27.

4-level data is first roughly written in a memory cell (MLC) connected with a word line WLn in a block MLB (S11). Upon this writing, data corresponding to 2 pages (2 bits), ECC data, and a page address of a block SLB associated with this page are roughly written. The page address of this block SLB is written as, e.g., data of 1 bit at threshold levels of, e.g., "Erase" ("11") and "b" ("00") depicted in FIG. 13 (1). Thereafter, data SB of 1 bit generated from multilevel data corresponding to 2 pages is written into a block SB.

Subsequently, data in a memory cell connected with a word line WLn-1 in the block MLB is restored (S12). First, data is read from the memory cell at read levels A_R, B_R, and C_R. Thereafter, data is read from the memory cell at a read level D_R (S13). At this time, since a threshold distribution is as shown in FIG. 13 (2), the read data may possibly be incorrect. However, an address of the block SLB associated with the page in the read data is written at 2-level threshold levels "Erase" and "b" as shown in FIG. 13 (1). Therefore, the data read at the read level D_R is accurate data. Based on the read address of the block SLB, 2-level data written in the block SLB is read out (S14). Based on this read 2-level data, 4-level data is corrected (S15).

Then, data is again read out from a memory cell connected with a word line WL(n-1) in the block MLB at a read level E_R (S16). Based on this read data, 4-level data is corrected (S17).

After restoring the data in the memory cell connected with the word line WLn-1 in this manner, fine writing is effected in the memory cell connected with the word line WLn-1. At the same time, flag data indicating that multilevel writing is completed is also written (S18). The flag data is written at a level of "a" or "b" changed from "Erase" depicted in FIG. 13 (1). The flag data is not roughly written. Therefore, a threshold level of the flag data may possibly be shifted due to capacitance coupling of floating gates of the cell into which the flag data is written and a cell adjacent thereto. Therefore, it is preferable to eliminate an influence of capacitance coupling with respect to the cell into which the flag data is written and the cell adjacent thereto as, e.g., dummy cells into which no data is written.

It is to be noted that a cell into which the flag data is written and a cell that stores an address of the block SLB are not restricted to one cell. To improve reliability of the flag data or the address, a plurality of cells may store the flag data or the address and the flag data or the address may be determined based on the rule of majority of data read from the plurality of cells.

Figure 28:
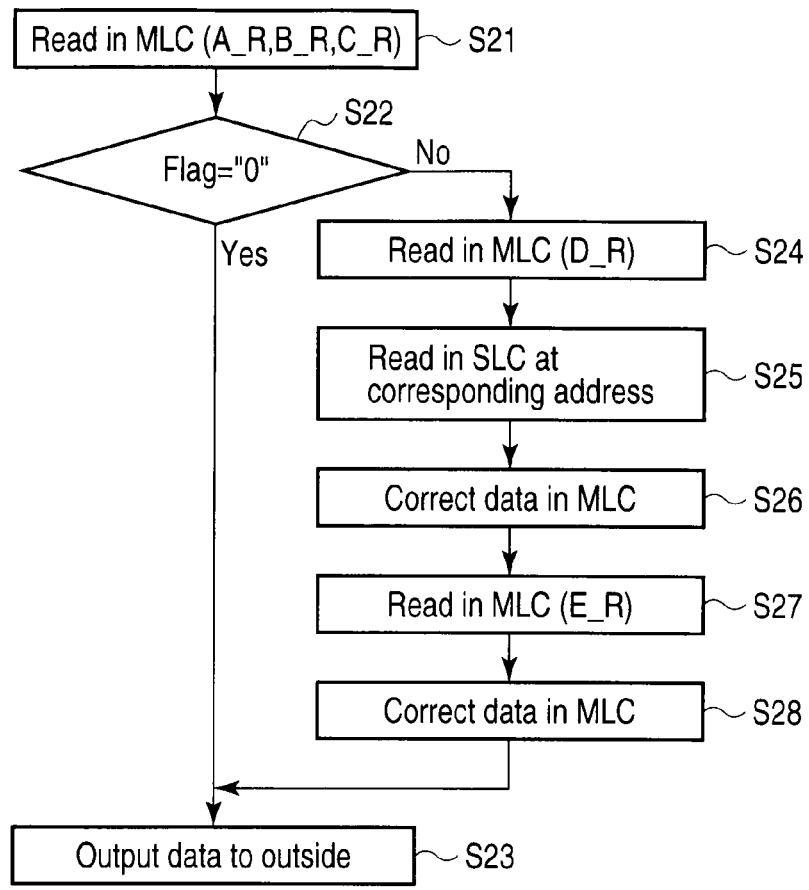
FIG. 28 is a flowchart showing a read operation according to the fifth embodiment.

FIG. 28 shows a flowchart of a read operation according to the fifth embodiment. In the fifth embodiment, each page of the block MLB includes flag data. The flag data is indicative of whether fine writing has been executed. Therefore, a data read sequence differs depending on the content of the flag data.

When reading data, data is first read from the block MLB at read levels A_R, B_R, and C_R (S21). Whether the flag data has been written is judged based on the read data (S22). That is, the flag data has been written when the read data is "0", and the flag data has not been written when the read data is "1". As a result, when it is determined that the flag data has been written, fine writing of a read page in the block MLB is completed. Therefore, the data read at the step S21 is output to the outside as correct data (S23).

On the other hand, when the flag data is not written, since the data read at the step S21 is not accurate, data is read from the block MLB at a read level D_R (S24). Then, data is read from an address of the block SLB associated with a read page of the block MLB (S25). The data read from the block MLB is corrected based on this read data (S26). Subsequently, data is read from the block MLB at a read level E_R (S27). The data read from the block MLB at the read levels A_R, B_R, and C_R is corrected based on this read data (S28), and it is output to the outside (S23).

According to the fifth embodiment, an address of the block SLB associated with a page of the block MLB is written in this page. Therefore, data SB can be read from the block SLB based on this address. Accordingly, since the address of the block SLB does not have to be supplied from the external controller, control of the controller can be facilitated.

Moreover, the page of the block MLB has a write region 202 for flag data indicative of whether fine writing is completed. Therefore, when the flag data is written in this region 202 at the time of reading data, since the read data can be immediately output to the outside as correct data, the data read operation can be accurately and rapidly executed. Additionally, when no data is written in this region 202, correcting this read data enables outputting accurate data.

Sixth Embodiment

In the fifth embodiment, flag data and an address of the block SLB are written in a page of the multilevel region besides data and ECC data. Additionally, to improve reliability of data, increasing an error correcting capability for the multilevel region is demanded. In this case, the number of pieces of ECC data must be increased. On the other hand, data and ECC data alone are written in a page of a 2-level region. Further, since a correcting capability lower than that for a multilevel ECC can suffice, the number of necessary pieces of ECC data can be small. It is often the case that arranging both the 2-level region and the multilevel region in the same memory cell array is desirable for the sake of layout, and the 2-level region and the multilevel region have the same page length in this case. Therefore, the page of the 2-level region have many unused regions. Furthermore, an address of the block SLB in the page of the multilevel region is no longer required when multilevel fine writing is completed.

Figure 29A:
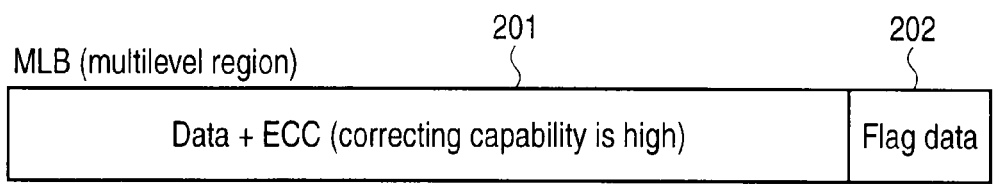
FIGS. 29A and 29B are views showing an assignment mode for data in a page applied to a sixth embodiment.

FIG. 29A shows assignment of data in a page of a block MLB as a multilevel region according to a sixth embodiment. A page of the block MLB has a storage region 201 for data and ECC data and a storage region 202 for flag data alone but does not have a storage region of an address of a block SLB. Therefore, a page length can be reduced beyond that in the fifth embodiment.

Figure 29B:
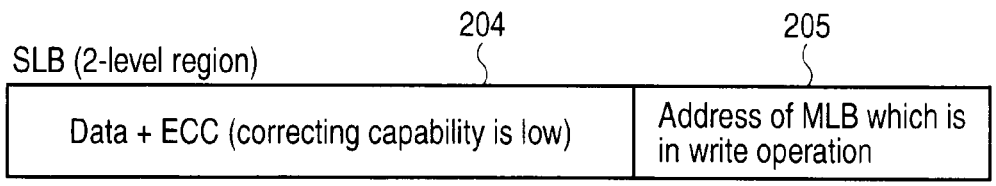

FIG. 29B shows assignment of data in the block SLB as a 2-level region. A page of the block SLB has a storage region 2014 for data and a storage region 205 for a page address of the block MLB which is in a write operation. The storage region 204 for data can include small ECC data.

Moreover, a non-illustrated storage region for flag data may be provided in, e.g., a page of the block SLB in such a manner that whether the block SLB is utilized can be judged based on the flag data stored in this storage region.

In the sixth embodiment, whether the block MLB has a page which is still in a write operation must be judged. Therefore, after a power supply is turned on, or when first multilevel fine writing is required, data is read from all blocks SLBs present in a memory cell array 1, and a page address of a block MLB written in this data is read out. A table including this page address of the block MLB and a page address of a block SLB where the address is stored in, e.g., a storage circuit in the control signal and control voltage generator circuit depicted in FIG. 7. Here, the stored addresses are addresses of cells in which multilevel writing is performed (a cell in which rough writing is terminated but fine writing is not carried out) and a page address of a block SLB storing data SB associated with this address.

Here, for example, rough writing is performed in a memory cell at a block address A connected with a word line WLn, and then fine writing must be carried out in a memory cell at the block address A connected with a word line WLn−1. Since the block address A is present in each of the data latch circuits ADL and XDL, an address of a block SLB is specified.

According to the sixth embodiment, the block MLB does not store the address of the block SLB. Therefore, a page size can be reduced.

It is to be noted that, when one block SLB is assigned to one block MLB in the fifth and sixth embodiments, it is sufficient to store block addresses alone as an address of the block MLB and an address of the block SLB. Therefore, the above-described data can be stored in, e.g., a memory cell connected with a specific word line in 64 word lines and can be read out from the same.

Furthermore, to improve reliability, the above-described data may be stored in cells connected with a plurality of specific word lines, and decisions may be made by majority from the read data.

Moreover, in a case where data and a parity bit are added to a plurality of specific word lines and data is read from a cell selected based on a given word line, when a read result is determined as an error, data can be read from a cell selected based on a different word line.

Additionally, at the time of multilevel writing, data SB is temporarily stored in an unused cell. Although a block where 2-level data is stored is arbitrary, the number of times of writing or erasing in a specific cell alone must be prevented from being increased. Therefore, for example, circulating an address of a block where data SB is temporarily stored enables preventing the number of times of writing or erasing in the specific cell from being increased.

Seventh Embodiment

Figure 30:
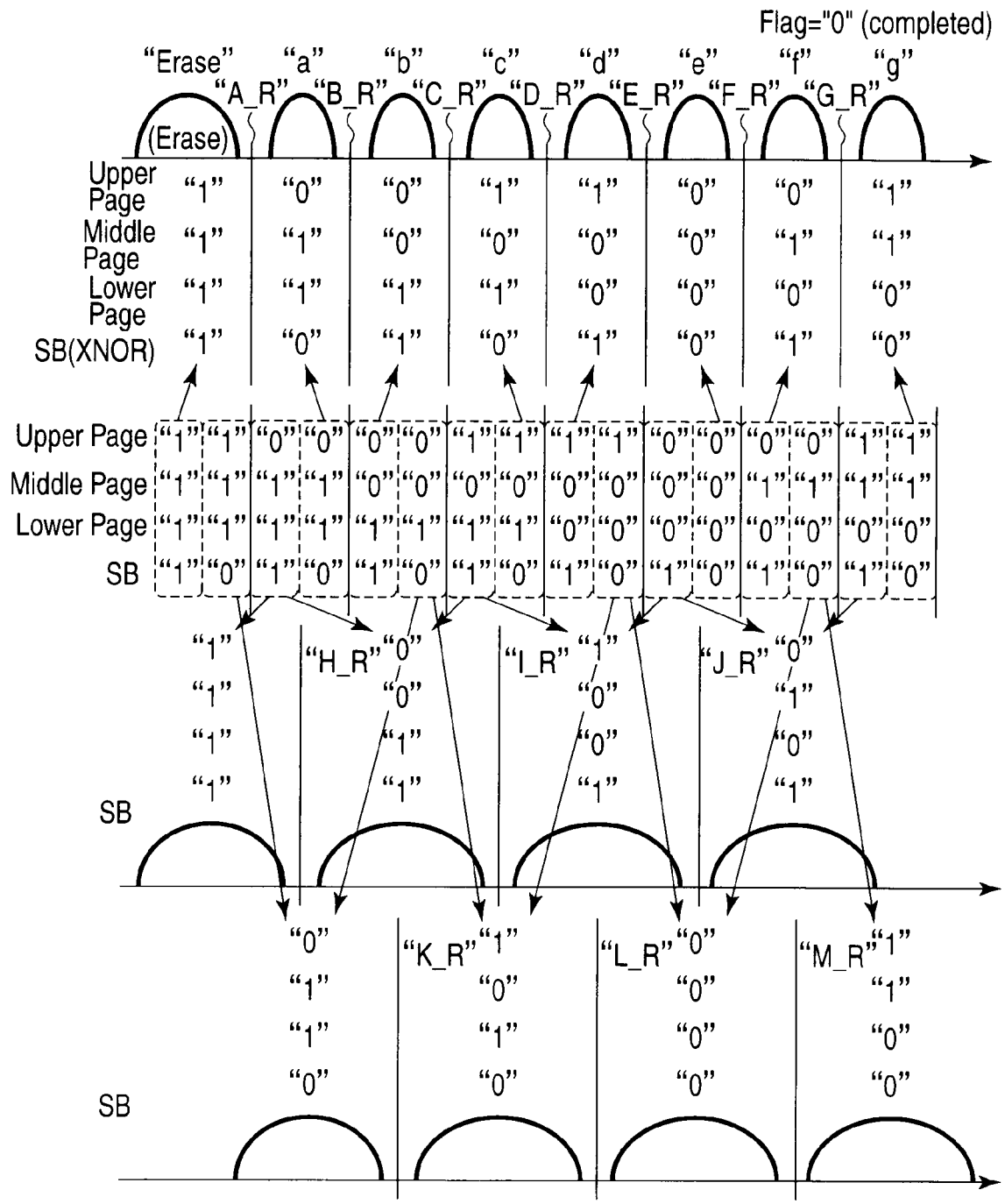
FIG. 30 is a view showing an example of storing 8-level data according to a seventh embodiment.

FIG. 30 shows a seventh embodiment. The example of storing 4-level data in one memory cell has been described in each of the foregoing embodiments. Therefore, an example of storing 8-level data in one memory cell will be described in the seventh embodiment.

A write operation when storing 8-level data is basically the same as a 4-level data write operation. When storing 8-level data, data SB of 1 bit is generated based on data of 3 bits associated with a lower page, a middle page, and an upper page. This data SB is written at an address in a block SLB associated with a block MLB in rough writing of 8-level data. Before fine writing of 8-level data, roughly written 3-bit data in the 8-level data is read by using data at read levels "A_R" to "G_R", and the data SB of 1 bit is read. Based on such data, whether the read data is correct is judged. As a result of the judgment, incorrect data is corrected by data read at read levels "H_R", "I_R", "J_R", "K_R", "L_R", and "M_R". Based on the corrected data, fine writing of 8-level data is carried out.

Reading the 8-level data is substantially the same as reading 4-level data, and the incorrect data is corrected by using the data read at the read levels "H_R", "I_R", "J_R", "K_R", "L_R", and "M_R".

According to the seventh embodiment, the 8-level data can be written and read like the 4-level data, and hence the same effect as that in the 4-level data can be obtained.

Further, the second to sixth embodiments can be applied to the 8-level data.

Eighth Embodiment

Figure 42:
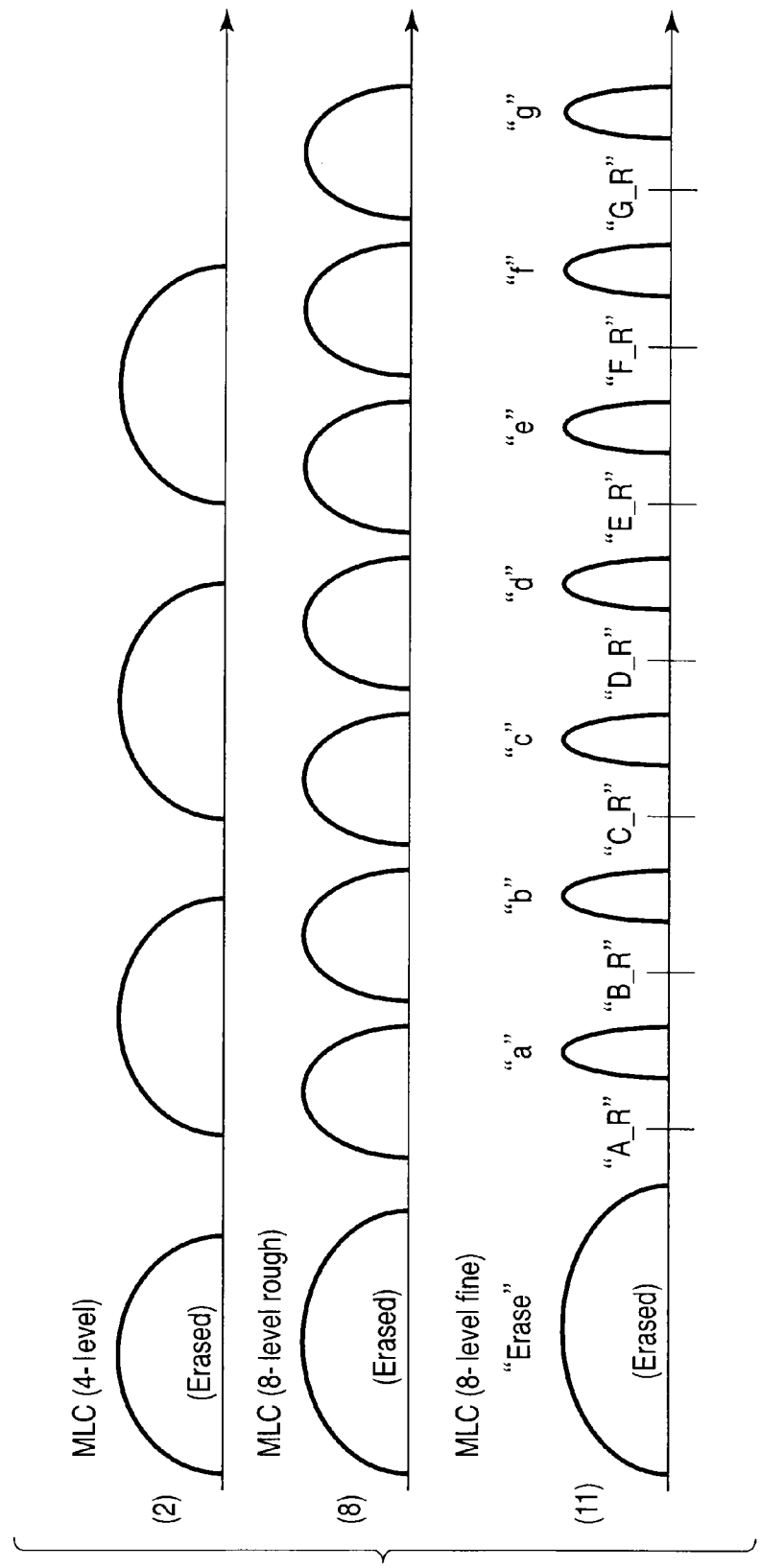
FIG. 42 is a view schematically showing a change in threshold level written into a memory cell in a block MLB as a multilevel region according to an eighth embodiment.
Figure 43:
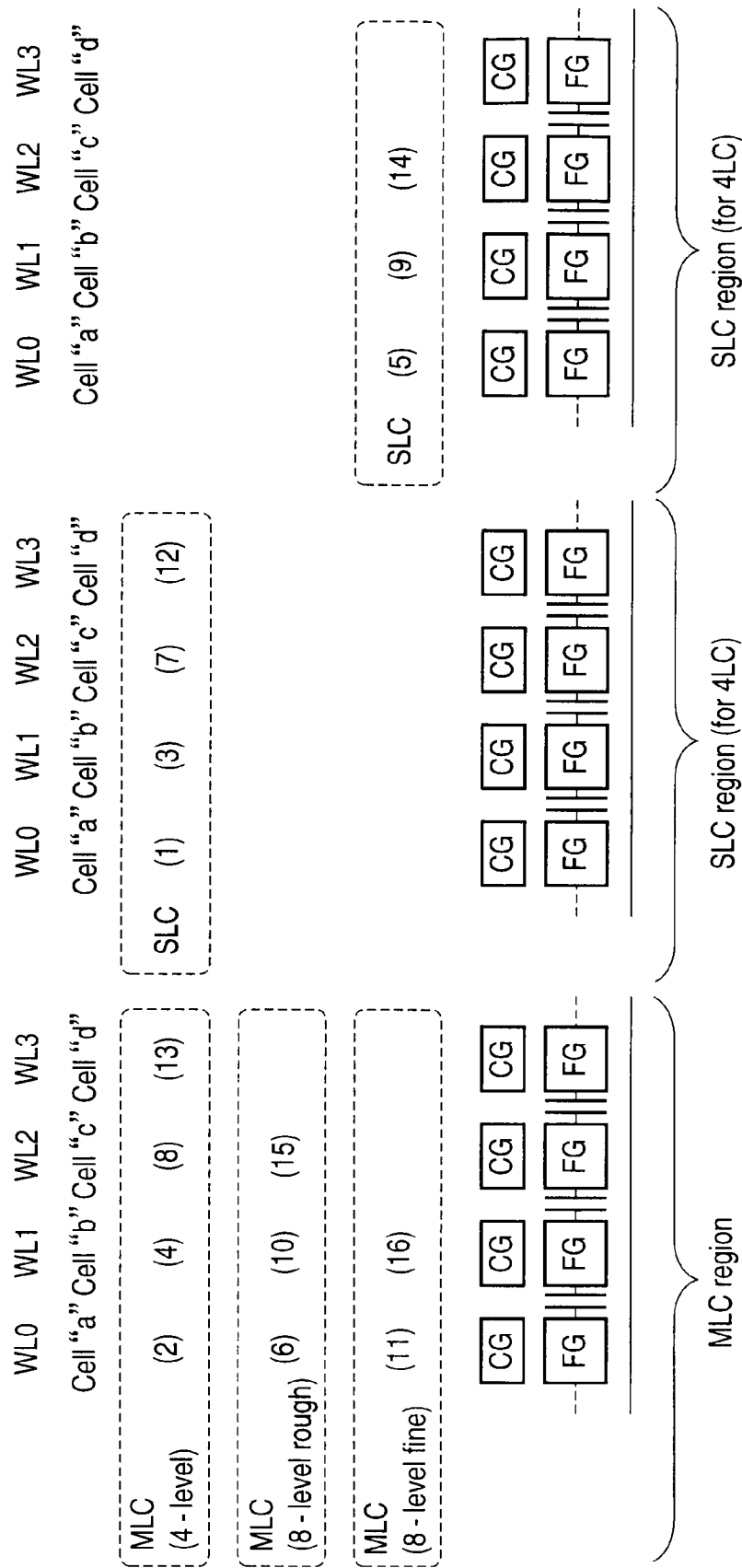
FIG. 43 is a view showing a write order according to the eighth embodiment.
Figure 44:
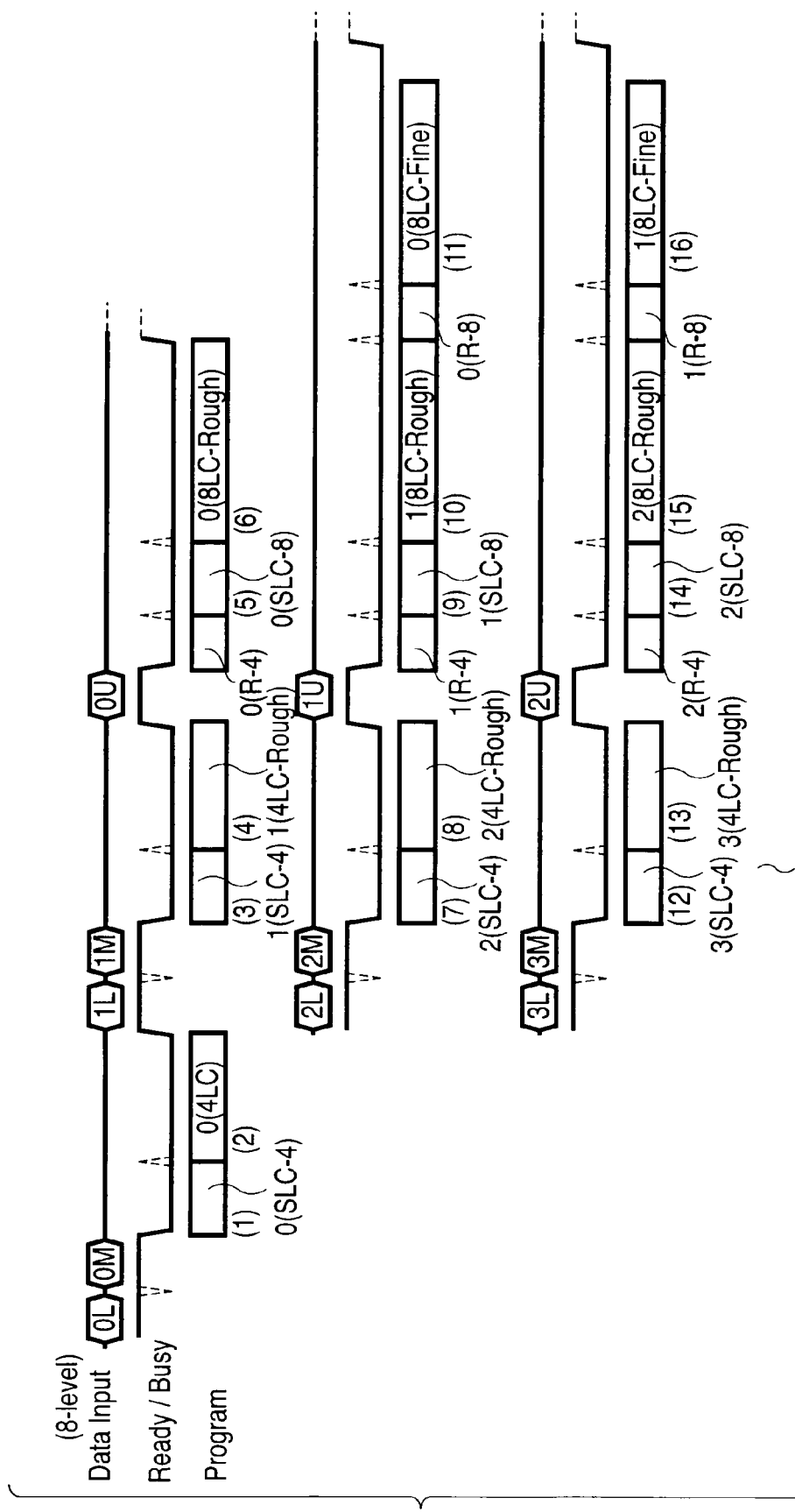
FIG. 44 is a timing chart showing an example of a write sequence according to the eighth embodiment.

FIGS. 42, 43, and 44 show an eighth embodiment, i.e., another example of 8 levels. In the eighth embodiment, as shown in FIG. 42, paying attention to a block MLB, 4-level writing, 8-level rough writing, and 8-level fine writing are sequentially executed. This operation will be specifically described hereinafter. It is to be noted that a description will be given on the assumption that memory cells connected with word lines WL0 to WL3 are Cell "a" to Cell "d", a cell in a block MLB is MLC, and a cell in a block SLB is MLC.

(4-Level SLC Writing and 4-Level Writing in Cell "a")

First, 4-level data SB of 1 bit is generated based on 2-bit data of a lower page and a middle page which are written into a Cell "a". This 4-level data SB is written into a block as a 4-level data holding 2-level region associated with a multilevel block address (1). Furthermore, the 2-bit data of the lower page and the middle page is written into a block MLB as a multilevel region (2).

(4-Level SLC Writing and 4-Level Writing in Cell "b")

Then, 1-bit data SB is generated based on 2-bit data including a lower page and a middle page which are written into a Cell "b". This data SB is written into a block SLB as a 4-level data holding 2-level region associated with a multilevel block address (3). Further, the 2-bit data including the lower page and the middle page is written into the block MLB as a multilevel region (4).

(4-Level SLC Reading and 8-Level Rough Writing in Cell "a")

First, the 1-bit data of the upper page that is written into the Cell "a", the data written as a 4-level data in the Cell "a" of the multilevel block MLB, and the data SB written in the block SLB as the 4-level data holding 2-level region are read out to restore 8-level data. These pieces of data corresponding to 3 pages are used to generate 1-bit 8-level data SB. This 8-level data SB is written into a block SLB as an 8-level data holding 2-level region associated with a multilevel block address (5). Furthermore, 3-bit data including a lower page, a middle page, and an upper page is written into the block MLB of a multilevel region (6).

(4-Level SLC Writing and 4-Level Writing in Cell "c")

Then, 1-bit data SB is generated based on 2-bit data including a lower page and a middle page which are written into a Cell "c". This data SB is written into a block SLB as a 4-level data holding 2-level region associated with a block address of a multilevel region (7). Moreover, 2-bit data including the lower page and the middle page is written into the block MLB as the multilevel region (8).

(4-Level SLC Reading and 8-Level Rough Writing in Cell "b", 8-Level SLC Reading, and 8-Level Fine Writing)

First, 1-bit data of an upper page which is written into the Cell "b", data written as a 4-level data in the Cell "a" of the block MLB as the multilevel region, and data SB written in the block SLB as the 4-level data holding 2-level region are read to restore 8-level data. Based on these pieces of data corresponding to 3 pages, 1-bit 8-level data SB is generated. This 8-level data SB is written into a block SLB as an 8-level data holding 2-level region associated with a multilevel block address (9). Additionally, 3-bit data including a lower page, a middle page, and an upper page is written into the block MLB (10). Finally, data roughly written as 8-level data in the Cell "a" of the block MLB as the multilevel region and data SB written in the block SLB as the 8-level data holding 2-level region are read to restore 8-level data. This 3-bit data including the lower page, the middle page, and the upper page is finely written into the block MLB of the multilevel region (11).

Here, the data roughly written as 8-level data in the Cell "a" of the block MLB of the multilevel region and the data SB written in the block SLB as the 8-level data holding 2-level region are read to restore the 8-level data, but reliability can be further increased by reading the data roughly written as 8-level data in the Cell "a" of the block MLB as the multilevel region, the data SB written in the block SLB as the 8-level data holding 2-level region, and the data SB written in the block SLB of the 4-level data holding 2-level region to restore 8-level data.

Figure 46:
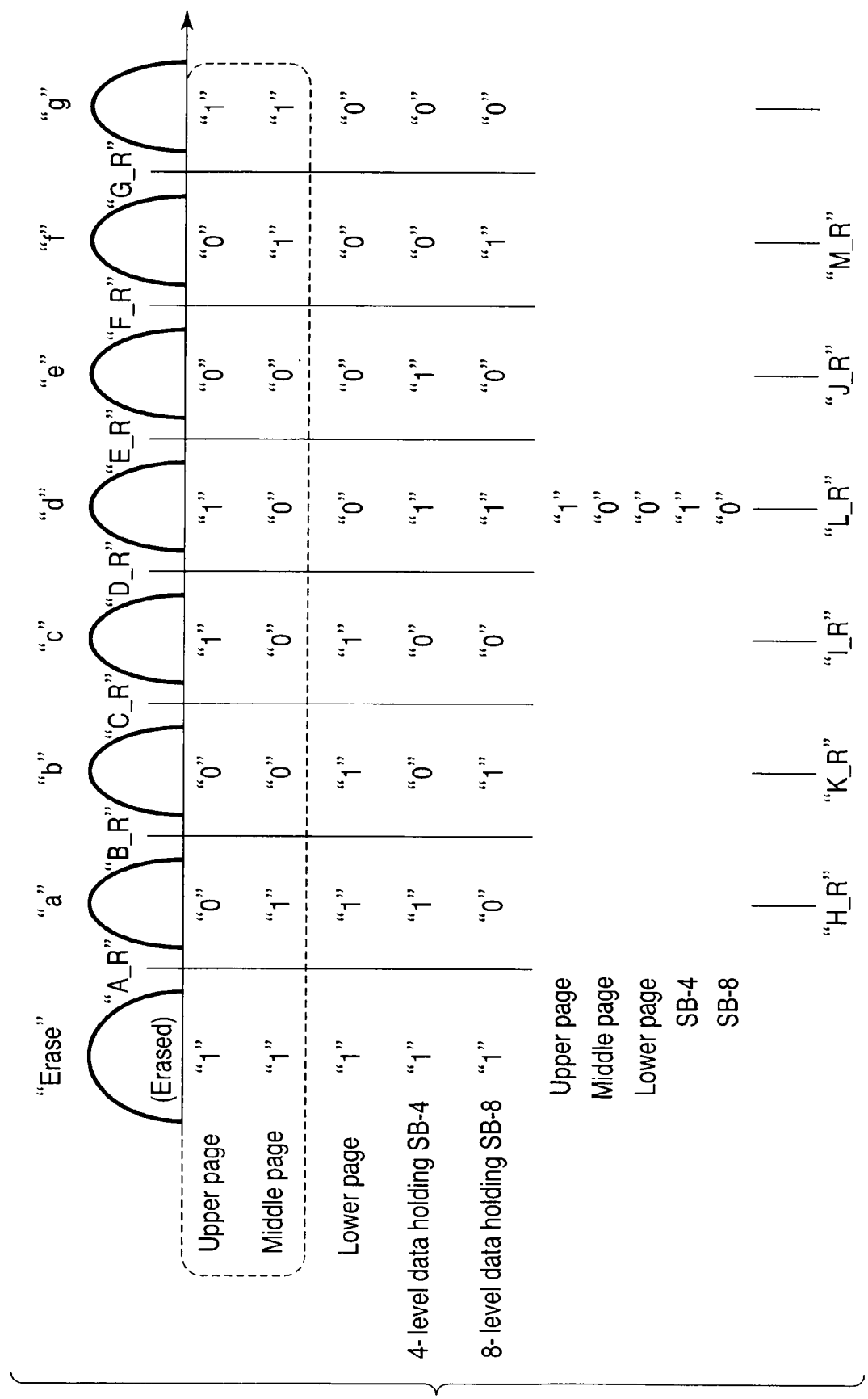
FIG. 46 is a timing chart showing an example of the write sequence according to the eighth embodiment.

FIG. 46 shows the data of the MLB, the data SB written in the block SLB as the 8-level data holding 2-level region, and the data SB written in the block SLB as the 4-level data holding 2-level region. The data SB written in the block SLB as the 8-level data holding 2-level region and the data SB written in the block SLB as the 4-level data holding 2-level region are considered to be correct data. For example, when ("1", "0", "0", "1", "0") is read as the upper page, the middle page, the lower page, the 4-level data holding data SB, and the 8-level data holding data SB, the 4-level data holding data SB "1" and the 8-level data holding data SB "0" are considered to be correct. Since the 4-level data holding data SB is "1" and the 8-level data holding data SB is "0" when a threshold voltage is "a" or "e", the threshold voltage is "a" when reading is effected at an intermediate level of a read level B_R and a read level E_R, i.e., a read level I_R on a side close to B_R, or the threshold voltage is "e" when reading is effected at the same level on a side close to E_R.

The eighth embodiment can obtain the same effect as that of the seventh embodiment.

Ninth Embodiment

Figure 31:
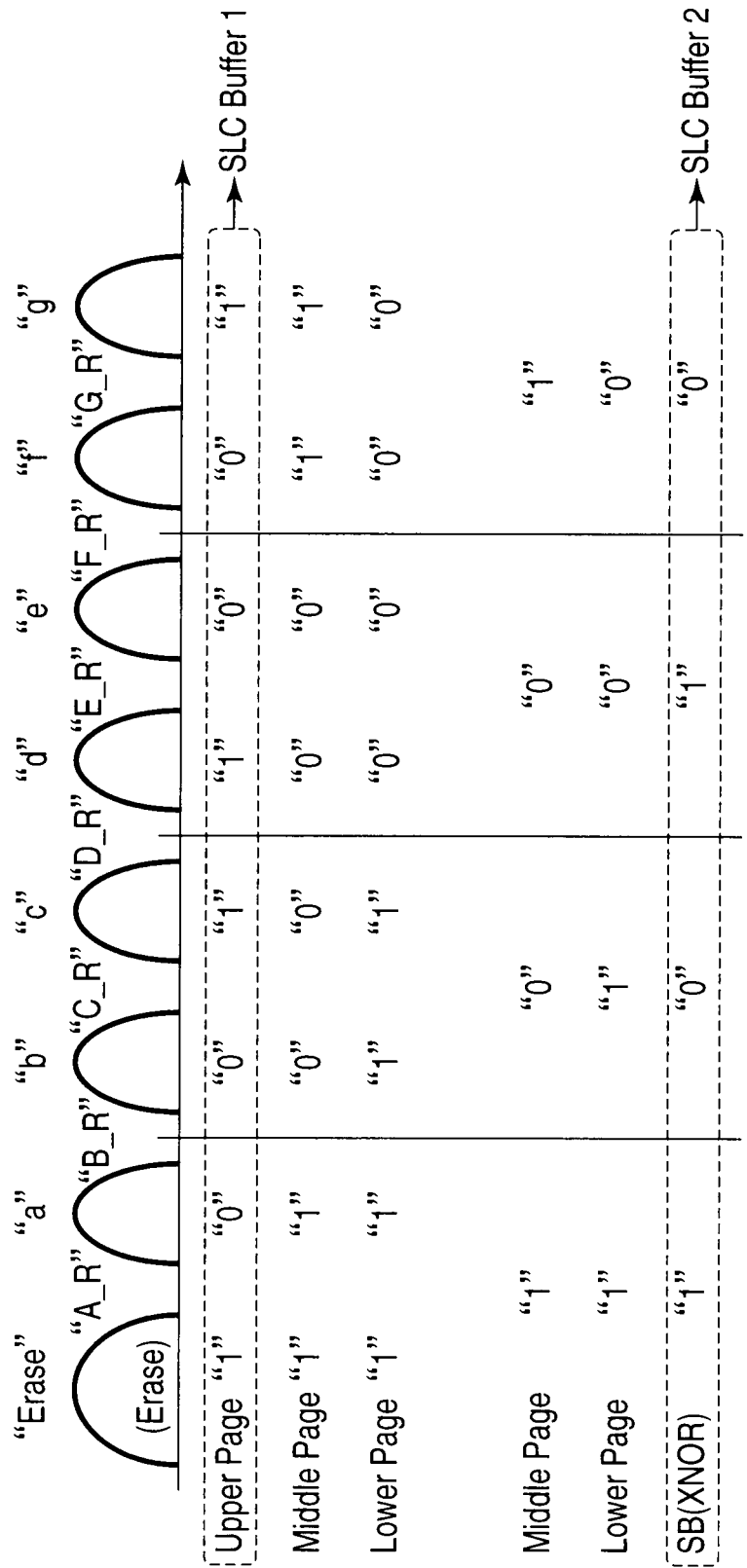
FIG. 31 is a view showing an example of storing 8-level data according to a ninth embodiment.

FIG. 31 shows another example of 8 levels according to a ninth embodiment. In the ninth embodiment, 1-bit data of an upper page is written at an address of a block SLB associated with a block MLB as it is. 1-bit data SB is generated from 2-bit data including a lower page and a middle page. This data SB is written at a different address of the block SLB. This operation is the same as that of writing 4-level data.

In the ninth embodiment, a memory capacity of the block SLB that is double a memory capacity in the seventh embodiment is required, but 8-level data can be assuredly stored.

Further, in each of the foregoing embodiments, rough writing is effected in a memory cell of a block MLB before writing multilevel data, data SB generated from the multilevel data is temporarily stored in a block SLB, then the multilevel data is roughly written in an adjacent cell, write data is restored by using the roughly written data and the data in the SLB, and the multilevel data is finely written into the memory cell where data has been written ahead of the adjacent cell.

However, when write data of a next page is known, writing in the block SLB and restoration of data are not carried out, but rough writing is effected in the adjacent cell, and data is again supplied from a controller, thereby performing fine writing of the multilevel data.

10th Embodiment

In each of the foregoing embodiments, the storage region formed of cells that store k bits (k<n) in each memory cell is provided as well as the storage region of multilevel cells (MLCs) that store n bits in each memory cell. However, when a RAM (a random access memory) that holds data corresponding to a plurality of pages is present on a controller side, cells that store k bits (k<n) in each memory cell do not have to be provided. In such a case, this embodiment can be likewise applied.

Figure 45:
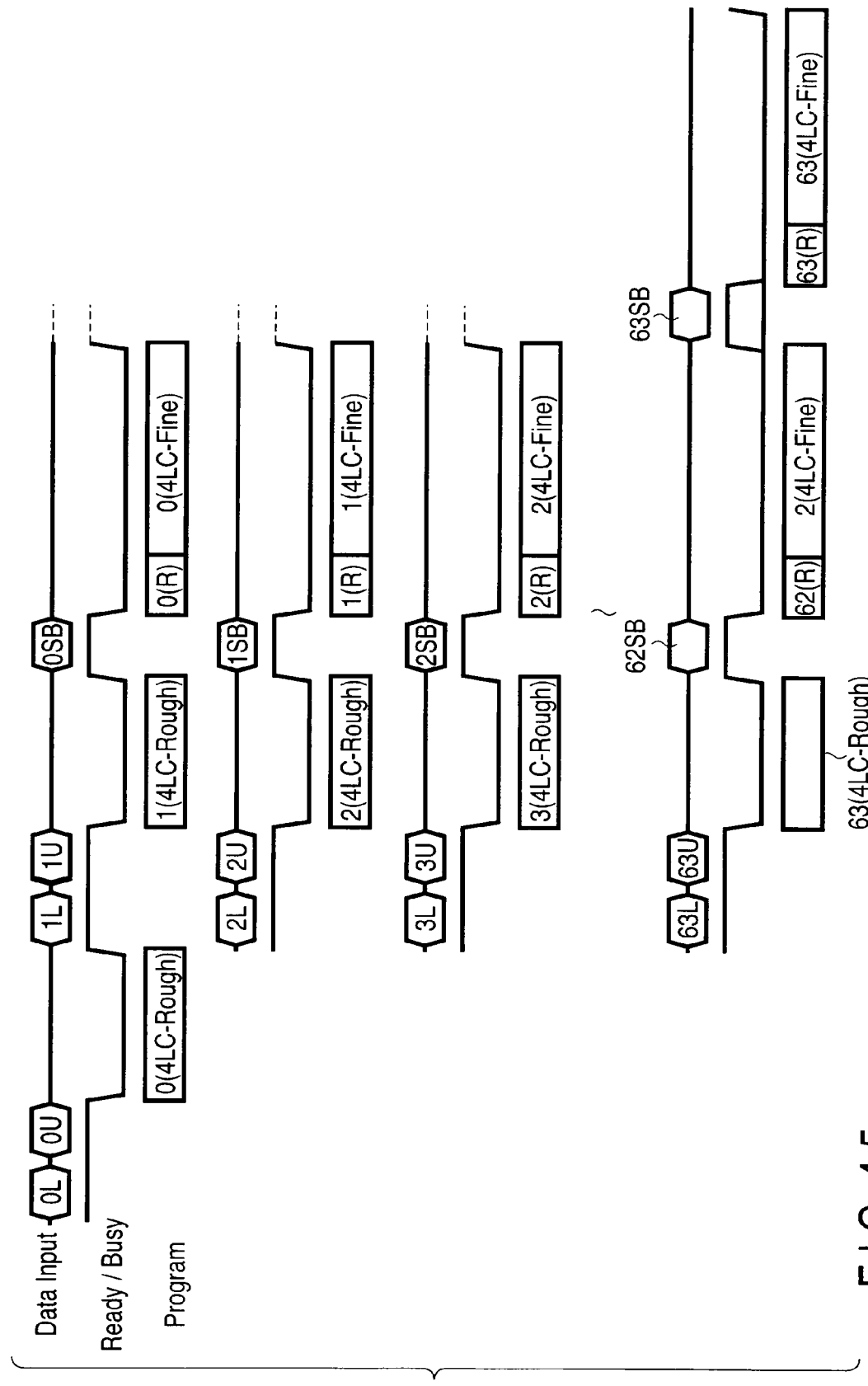
FIG. 45 is a timing chart showing an example of a write sequence according to a 10th embodiment.

FIG. 45 concerns the 10th embodiment where cells that store k bits (k<n) in each memory cell are not provided. An example of 4 levels will now be described.

(4-Level Rough Writing in Cell "a")

First, 4-level data is roughly stored based on 2-bit data including a lower page and an upper page which are written into a Cell "a" (a word line WL0). The controller must hold data corresponding to 2 pages, i.e., the lower page and the upper page which are written into the Cell "a" (the word line WL0) for fine writing in the conventional example. However, the 2-bit data including the lower page and the upper page is used to generate 1-bit data SB, and this generated data is held.

Therefore, a RAM on the controller side can be eliminated.

(4-Level Rough Writing in Cell "b")

First, 4-level data is roughly stored based on 2-bit data including a lower page and an upper page which are written into a Cell "b" (a word line WL1). The controller uses the 2-bit data including the upper page and the lower page to generate 1-bit data SB, and holds this data alone.

(4-Level Fine Writing in Cell "a")

The controller side supplies the 1-bit data SB generated based on the 2-bit data including the lower page and the upper page which are to be stored in the Cell "a" in a semiconductor memory device. The controller must supply data corresponding to 2 pages, i.e., an upper page and a lower page in the conventional example. However, in this embodiment, a transfer time is reduced to ½. This data SB and the roughly written data as 4-level data are read to restore 4-level data. The 2-bit data including the lower page and the upper page is finely written into a block MLB of a multilevel region.

The first embodiment is the example of 4 levels, the second to fourth embodiments are modifications, the fifth and sixth embodiments are examples of managing an address of a 2-level region in the semiconductor memory device, the seventh, eight, and ninth embodiments are examples of 8 levels, and the 10th embodiment is an example of providing no SLC region in the semiconductor memory device. However, 6-level data or higher-level data can be likewise written into or read from a memory cell like these embodiments. Further, the block SLB as a 2-level region is not restricted to 2 levels, and the block SLB that has a smaller number of bits than MLB as a multilevel region and has high reliability can suffice. That is, a plurality of cells may store 1-bit data. For example, two cells can store 1 bit.

Furthermore, since data written in the block SLB is no longer necessary when fine writing in the block MLB is terminated, the block SLB is used as a block SLB for writing in any other page or block MLB. Therefore, the number of times of writing/erasing (W/E) in cells of the block SLB is higher than the number of times of W/E in cells of the block MLB. Since the number of times of W/E in cells of the block SLB is higher than the number of times of W/E in cells in the block MLB from the beginning, this hardly leads to a problem. However, when the number of times of W/E in the block SLB is limited, the number of times of W/E in each block SLB can be reduced by increasing the number of blocks SLB and setting W/E to be uniformly effected in the blocks SLB. For example, when the number of blocks SLB is increased from 50 to 100, the number of times of W/E in cells of each block SLB can be suppressed to ½. Since the number of times of W/E in cells of the block SLB is higher than the number of times of W/E in cells of the block MLB, a block having an increased number of times of W/E in cells of the blocks MLB can be used as the block SLB. In this case, since the number of blocks SLB is increased as the number of times of W/E rises, a capacity of the semiconductor memory device is decreased. When the semiconductor memory device is applied to, e.g., a card, a reduction in memory capacity is convenient for users because ongoing degradation in a semiconductor memory device can be recognized.

Additionally, the foregoing embodiments can be combined to be carried out.

APPLICATION EXAMPLES

Applications to which the semiconductor memory device is applied will now be described.

Figure 32:
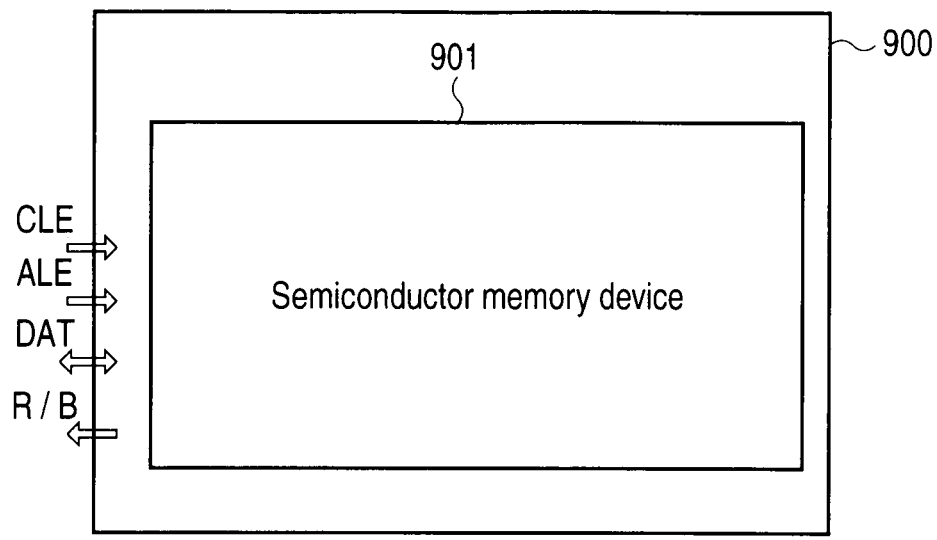
FIG. 32 is a diagram showing an application to which a semiconductor memory device according to the embodiment is applied.

FIG. 32 shows an example of a memory card to which the semiconductor memory device is applied. In FIG. 32, a memory card 900 has a semiconductor memory device 901 including a NAND flash memory explained in the foregoing embodiments. The semiconductor memory device 901 receives a predetermined control signal and data from a non-illustrated external equipment. Further, it outputs a predetermined control signal and data to the non-illustrated external equipment.

That is, a signal line (DAT) through which a command is transferred, a command-line-enable signal line (CLE) for a signal indicating that a command is transferred to the signal line DAT, an address-line-enable signal line (ALE) for a signal indicating that an address is transferred to the signal line DAT, and a ready/busy signal line (R/B) for a signal indicating that a flash memory can operate are connected to the semiconductor memory device 901 mounted on the memory card 900.

Figure 33:
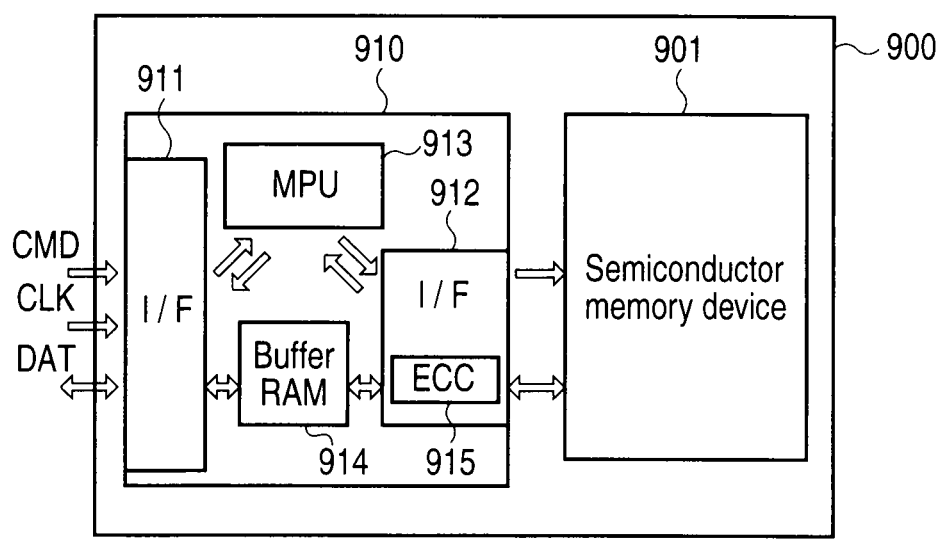

FIG. 33 shows an example of another memory card. Differing from the memory card depicted in FIG. 32, this memory card has a controller 910 that controls a flash memory 910 and supplies/transmits a signal to/from a non-illustrated external equipment.

The controller 910 has, e.g., an interface unit (I/F) 911 that receives a signal from a non-illustrated external equipment or outputs a signal to the external device, an interface unit 912 that supplies/receives a signal to/from a semiconductor memory device 901 including a NAND flash memory, a microprocessor (MPU) 913 that executes calculation of, e.g., converting a logic address input from the external device into a physical address, a RAM 914 as a buffer that temporarily stores data, and an error correction unit (ECC) 915 that generates an error correction code. Further, a command signal line (CMD), a clock signal line (CLK), and a signal line (DAT) are connected with the interface unit 911 of the memory card 900.

It is to be noted that the number of various signal lines, a bit width of the signals lines, and a configuration of the controller can be modified in the memory card. Furthermore, this structure can be applied to constitute an SSD (a solid state drive) that substitutes a hard disk.

FIG. 34 shows another application. As shown in FIG. 34, the memory card 900 is inserted into a card holder 920 to be connected with a non-illustrated electronic device. The card holder 920 may have part of functions of a controller 910.

FIG. 35 shows a further application. A memory card 900 or a card holder 920 holding the memory card therein is inserted into a connection apparatus 1000. The connection apparatus 1000 is connected with a board 1300 through a connection wiring line 1100 and an interface circuit 1200. A CPU 1400, a bus 1500, and other components are mounted on the board 1300.

Figure 36:
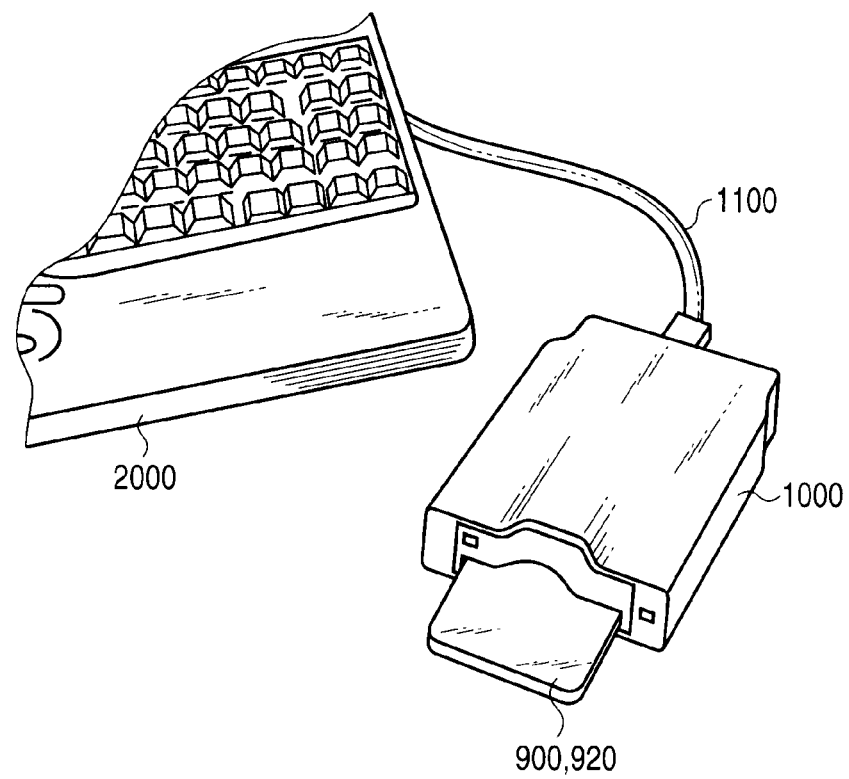

FIG. 36 shows another application. A memory card 900 or a card holder 920 holding the memory card 900 therein is inserted into a connection apparatus 1000. The connection apparatus 1000 is connected with a personal computer 2000 via a connection wiring line 1100.

Figure 37:
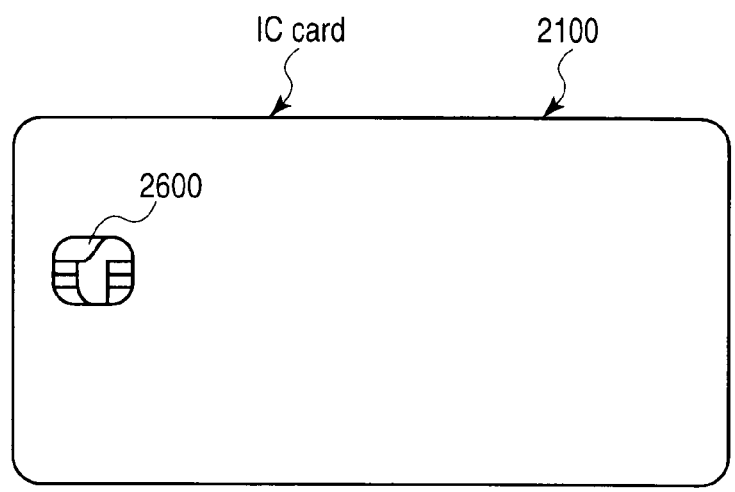

FIGS. 37 and 38 show another application. As shown in FIGS. 37 and 38, an MCU 2200 is mounted in an IC card 2100. The MCU 2200 includes a semiconductor memory device 901 including a NAND flash memory according to the foregoing embodiments, a ROM 2300, a RAM 2400, and a CPU 2500, for example. The IC card 2100 has a plane terminal 2600 exposed on one surface thereof as shown in FIG. 37, and the plane terminal 2600 is connected with the MCU 2200. The CPU 2500 includes a calculation unit 2510, a flash memory 3, and a control section 2520 connected with a ROM 2300 and a RAM 2400.

Figure 39:
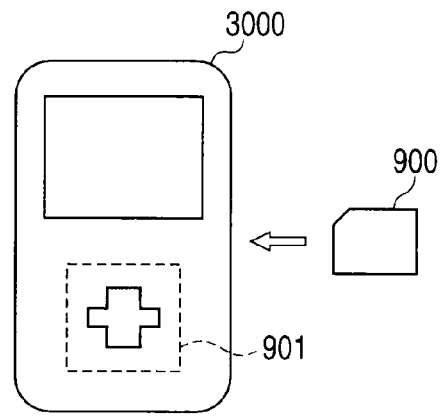

FIG. 39 shows a further application and shows an example of a portable audio player 3000. This portable audio player 3000 has a built-in semiconductor memory device 901 including a NAND flash memory according to the foregoing embodiments in a main body therein. Furthermore, a memory card 900 including the NAND flash memory can be attached to this portable audio player 3000.

Figure 40:
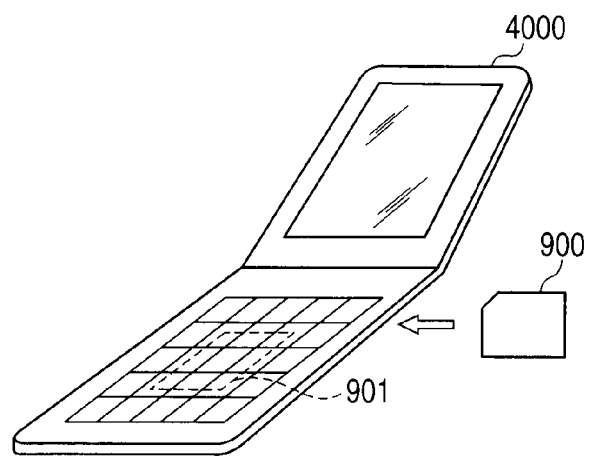

FIG. 40 shows another application and shows a portable terminal 4000 such as a cellar phone 3000. The portable terminal 4000 has a built-in semiconductor memory device 901 including the NAND flash memory according to the foregoing embodiments in a main body thereof. Moreover, a memory card 900 including the NAND flash memory can be attached to this portable terminal 4000.

Figure 41:
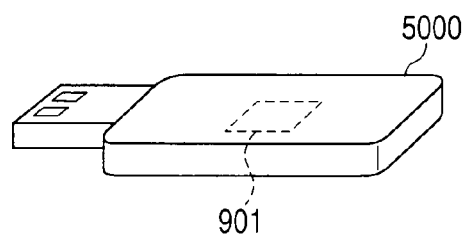

FIG. 41 shows a further application and shows, e.g., a USB memory 5000. The USB memory 5000 has a built-in semiconductor memory device 901 including the NAND flash memory according to the foregoing embodiments in a main body thereof.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
 a first memory cell configured to store data of k bits (k is a natural number of 2 or more); and
 a second memory cell configured to store data of h bits (h<k);
 wherein the first memory cell stores data of i bits (i<=k) by one threshold levels of a first level, a second level, a third level to a $2^i$th level, and the second memory cell stores data of h bits (h<i) including a first state or a second state, the second memory cell stores the first state when the data of i bits is one of the first level, the third level to a $(2^i-1)$th level, and stores the second state when the data i bits is one of the second level, the fourth level to the $2^i$th level.

2. The device according to claim 1, further comprising:
 a third memory cell configured to store data of n (n<=k) bits adjacent to the first memory cell,
 wherein data of j bits (j<=k) is stored in the third memory cell after storing the data of i bits in the first memory cell and the data of h bits in the second memory cell, and the data of i bits is read from the first memory cell and the data of h bits is read from the second memory cell.

3. The device according to claim 1,
 wherein, after the data of i bits is read from the first memory cell and the data of h bits is read from the second memory cell, data of i bits is again stored in the first memory cell based on read data from the first and second memory cells.

4. The device according to claim 1,
 wherein the data of h bits which is written into the second memory cell is data produced from carrying out an exclusive NOR operation on the data of i bits stored in the first memory cell.

5. The device according to claim 1,
 wherein, after the data of i bits is stored in the first memory cell and the data of h bits is stored in the second memory cell, $2^i$ combinations based on data of (i+h) bits obtained from the data of i bits which is written into the first memory cell and the data of h bits which is written into the second memory cell in $2^{(i+h)}$ combinations based on the data of (i+h) bits obtained from data of i bits read from the first memory cell and data of h bits read from the second memory cell by a read operation are regarded as correct data, and read data from the first memory cell which does not belong to the $2^i$ combinations is regarded as incorrect data.

6. The device according to claim 1,
 wherein the first memory cell stores data of 2 bits (i=2), the second memory cell stores data of 1 bit (h=1), and read levels in a read operation for the first memory cell are A, B, C, E (A<E<B), and F (B<F<C) when write verify read levels for the first memory are A, B, and C (A<B<C), and A, B, C, D, E and F are bit levels.

7. The device according to claim 1,
 wherein, after data of 2 bits (i=2) is stored in the first memory cell at a write verify read level A, B, or C and data of 1 bit (h=1) is stored in the second memory cell, four combinations based on data of 2 bits obtained from the data of 2 bits which is written into the first memory cell and the data of 1 bit which is written into the second memory cell in eight combinations based on data of 3 bits obtained from data of 2 bits read from the first memory cell at the read level A, B, or C and 1 bit data read from the second memory cell are regarded as correct data, and read data from the first memory cell which does not belong to the four combinations is regarded as incorrect data, and A, B and C are bit levels.

8. The device according to claim 7,
 wherein when the read data is incorrect, data in the first memory is again read at the read levels E (A<E<B) and F (B<F<C), and A, B, C, D, E and F are bit levels.

9. A semiconductor memory system comprising:
 a first memory cell which stores data of k bits (k is a natural number of 2 or more),
 wherein data of i bits (i<=k) is stored in the first memory cell, the data of i bits are stored in the first memory cell as one of threshold levels of a first level, a second level, a third level to a $2^i$th level, and
 wherein data of h bits (h<i) including a first state or a second state is generated, the first state is generated when the data of i bits is one of the first level, the third level to a $(2^i-1)$th level, and the second state is generated when the data of i bits is one of the second level, the fourth level to the $2^i$th level.

10. The system according to claim 9,
 wherein the data of i bits are again stored in the first memory cell based on data of i bits read from the first memory cell and the data of h bits.

11. The system according to claim 10,
 wherein, before again storing the data of i bits in the first memory cell, data is stored in a second memory cell adjacent to the first memory cell.

12. The system according to claim 9,
 wherein the data of h bits is data which carried out exclusive NOR of the data of i bits stored in the first memory cell.

13. The system according to claim 9,
 wherein, after the data of i bits is stored in the first memory cell, $2^i$ combinations based on data of (i+h) bits obtained from the i bit data which is written into the first memory cell and the h-bit data in $2^{(i+h)}$ combinations based on the data of (i+h) bits obtained from the i bit data read by a read operation and the h bit data are regarded as correct data, and read data which does not belong to the $2^i$ combinations is regarded as incorrect data.

14. The system according to claim 9,
wherein the first memory cell stores data of 2 bits (i=2), and read levels of a read operation for the first memory cell are A, B, C, E (A<E<B), and F (B<F<C) when write verify read levels for the first memory cell are A, B, and C (A<B<C), and A, B, C, C, E and F are bit levels.

15. The system according to claim 9,
wherein data of 2 bits (i=2) is stored in the first memory cell at a write verify read level A, B, or C, data of 1 bit (h=1) is generated from the data of 2 bits stored in the first memory cell, four combinations based on the data of 2 bits which is written into the first memory cell and the generated data of 1 bit in eight combinations based on data of 3 bits obtained from data of 2 bits read from the first memory cell at the read level A, B, or C by a read operation and the generated data of 1 bit are regarded as correct data, and read data from the first memory cell which does not belong to the four combinations is regarded as incorrect data, and A, B, and C are bit levels.

16. The system according to claim 15,
wherein, when the read data from the first memory cell is incorrect, the data in the first memory cell is again read at read levels E (A<E<B) and F (B<F<C), and A, B, C, D, E and F are bit levels.

17. A storage method of a semiconductor memory device, comprising:
storing data of i bits (i<=k) (k is a natural number of 2 or more) in a first memory cell; and
storing data of h bits (h<i) generated by calculating from the data of i bits in a second memory cell, wherein the first memory cell stores data of i bits (i<=k) by one threshold levels of a first level, a second level, a third level to a $2^i$th level, and the second memory cell stores data of h bits (h<i) including a first state or a second state, the second memory cell stores the first state when the data of i bits is one of the first level, the third level to a $(2^i-1)$th level, and stores the second state when the data i bits is one of the second level, the fourth level to the $2^i$th level.

18. The method according to claim 17,
wherein data of i bits is again stored in the first memory cell based on the data of i bits read from the first memory cell and the data of h bits.

19. The method according to claim 17,
wherein the data of h bits which is written into the second memory cell is data produced from carrying out an exclusive NOR operation on the data of i bits stored in the first memory cell.

20. The method according to claim 17,
wherein, after the data of i bits is stored in the first memory cell and the data of h bits is stored in the second memory cell, $2^i$ combinations based on (i+h) bit data obtained from the data of i bits which is written into the first memory cell and the data of h bits which is written into the second memory cell in $2^{(i+h)}$ combinations based on (i+h)-bit data obtained from data of i bits read from the first memory cell by a read operation and data of h bits read from the second memory cell are regarded as correct data, and read data from the first memory cell which does not belong to the $2^i$ combinations is regarded as incorrect data.

* * * * *